(12) United States Patent
Griffiths

(10) Patent No.: US 10,056,551 B2
(45) Date of Patent: *Aug. 21, 2018

(54) POLYCYCLIC AROMATIC HYDROCARBON POLYMERS AND THEIR USE AS ORGANIC SEMICONDUCTORS

(71) Applicant: SMARTKEM LIMITED, Manchester (GB)

(72) Inventor: Russell Jon Griffiths, Bolton (GB)

(73) Assignee: SMARTKEM LIMITED, Manchester (GB)

( * ) Notice: Subject to any disclaimer, the term of this patent is extended or adjusted under 35 U.S.C. 154(b) by 678 days.

This patent is subject to a terminal disclaimer.

(21) Appl. No.: 14/379,797

(22) PCT Filed: Feb. 25, 2013

(86) PCT No.: PCT/GB2013/050462
§ 371 (c)(1),
(2) Date: Aug. 20, 2014

(87) PCT Pub. No.: WO2013/124687
PCT Pub. Date: Aug. 29, 2013

(65) Prior Publication Data
US 2015/0014599 A1    Jan. 15, 2015

(30) Foreign Application Priority Data
Feb. 23, 2012    (GB) .................................. 1203159.7

(51) Int. Cl.
*C08G 61/12* (2006.01)
*H01L 51/00* (2006.01)
(Continued)

(52) U.S. Cl.
CPC .......... *H01L 51/0036* (2013.01); *C08G 61/02* (2013.01); *C08G 61/10* (2013.01);
(Continued)

(58) Field of Classification Search
None
See application file for complete search history.

(56) References Cited

U.S. PATENT DOCUMENTS 3,557,233 A    1/1971  Zweig et al.
5,998,045 A   12/1999  Chen et al.
(Continued)

FOREIGN PATENT DOCUMENTS

CN    101361205    2/2009
DE    102009010713    9/2010
(Continued)

OTHER PUBLICATIONS

Database CA [Online] Chemical Abstracts Service, Columbus, OH, US; Sep. 10, 2009, GOTO, Daisuke et al., "Polymers having benzothieno[3,2-b]benzothiophene structures with good film forming ability and oxidative stability, and high solubility," XP002697699, retrieved from STN Database Accession No. 2009:1103025 abstract-& JP 2009 203447 A (Ricoh Co., Ltd., Japan), Sep. 10, 2009.

(Continued)

*Primary Examiner* — Katie L Hammer
(74) *Attorney, Agent, or Firm* — Parker Highlander PLLC

(57) ABSTRACT

The present invention relates to organic copolymers and organic semiconducting compositions comprising these materials, including layers and devices comprising such organic semiconductor compositions. The invention is also concerned with methods of preparing such organic semiconductor compositions and layers and uses thereof. The invention has application in the field of printed electronics and is particularly useful as a semiconducting material for use in formulations for organic thin film transistor (OFET) backplanes for displays, integrated circuits, organic light emitting diodes (OLEDs), photodetectors, organic photovol- (Continued)

taic (OPV) cells, sensors, memory elements and logic circuits.

40 Claims, 3 Drawing Sheets

(51) Int. Cl.

| | | |
|---|---|---|
| *C08K 5/01* | (2006.01) | |
| *C09D 165/00* | (2006.01) | |
| *C08G 61/02* | (2006.01) | |
| *C09D 11/52* | (2014.01) | |
| *C08G 61/10* | (2006.01) | |
| *C08G 75/06* | (2006.01) | |
| *H01L 51/05* | (2006.01) | |
| *H01L 51/42* | (2006.01) | |
| *H01L 51/50* | (2006.01) | |

(52) U.S. Cl.
CPC ........... *C08G 61/12* (2013.01); *C08G 61/126* (2013.01); *C08G 61/128* (2013.01); *C08G 75/06* (2013.01); *C08K 5/01* (2013.01); *C09D 11/52* (2013.01); *C09D 165/00* (2013.01); *H01L 51/0035* (2013.01); *H01L 51/0039* (2013.01); *H01L 51/0043* (2013.01); *C08G 2261/12* (2013.01); *C08G 2261/124* (2013.01); *C08G 2261/312* (2013.01); *C08G 2261/314* (2013.01); *C08G 2261/3142* (2013.01); *C08G 2261/3162* (2013.01); *C08G 2261/3243* (2013.01); *C08G 2261/51* (2013.01); *C08G 2261/5222* (2013.01); *C08G 2261/91* (2013.01); *C08G 2261/92* (2013.01); *C08G 2261/94* (2013.01); *C08G 2261/95* (2013.01); *H01L 51/055* (2013.01); *H01L 51/0508* (2013.01); *H01L 51/0512* (2013.01); *H01L 51/0541* (2013.01); *H01L 51/0545* (2013.01); *H01L 51/0558* (2013.01); *H01L 51/42* (2013.01); *H01L 51/50* (2013.01); *H01L 2251/30* (2013.01); *Y02E 10/549* (2013.01); *Y02P 70/521* (2015.11)

(56) References Cited

U.S. PATENT DOCUMENTS

| | | | |
|---|---|---|---|
| 6,630,566 | B1 | 10/2003 | Allen et al. |
| 6,690,029 | B1 | 2/2004 | Anthony et al. |
| 7,098,525 | B2 | 8/2006 | Bai et al. |
| 7,576,208 | B2 | 8/2009 | Brown et al. |
| 7,901,594 | B2 | 3/2011 | Takahasi |
| 7,985,353 | B2 | 7/2011 | Leeming et al. |
| 8,318,048 | B2 | 11/2012 | Tierney et al. |
| 8,398,895 | B2 | 3/2013 | Sparrowe et al. |
| 8,557,953 | B2 | 10/2013 | Heun et al. |
| 2003/0116755 | A1 | 6/2003 | Takahashi |
| 2004/0222412 | A1 | 11/2004 | Bai et al. |
| 2006/0058494 | A1 | 3/2006 | Busing et al. |
| 2007/0102696 | A1 | 5/2007 | Brown et al. |
| 2007/0244295 | A1 | 10/2007 | Fujita |
| 2008/0197325 | A1 | 8/2008 | Leeming et al. |
| 2008/0213624 | A1 | 9/2008 | Lecloux et al. |
| 2009/0149627 | A1* | 6/2009 | Pan .................. C08G 61/02 528/397 |
| 2009/0152531 | A1 | 6/2009 | Towns et al. |
| 2009/0247728 | A1 | 10/2009 | Pan et al. |
| 2010/0044684 | A1* | 2/2010 | Sirringhaus ......... H01L 51/0012 257/40 |
| 2010/0059738 | A1 | 3/2010 | Burroughes et al. |
| 2010/0093968 | A1 | 4/2010 | Cella et al. |
| 2010/0308304 | A1* | 12/2010 | Ogier .................. H01L 51/0541 257/40 |
| 2011/0073813 | A1 | 3/2011 | Caldwell et al. |
| 2011/0108813 | A1 | 5/2011 | Kohiro et al. |
| 2011/0180784 | A1 | 7/2011 | Shukla et al. |
| 2012/0079938 | A1 | 4/2012 | Celik et al. |
| 2014/0066560 | A1* | 3/2014 | Stoppelmann ........... C08K 7/14 524/407 |
| 2016/0204350 | A1 | 7/2016 | Griffiths |

FOREIGN PATENT DOCUMENTS

| | | |
|---|---|---|
| EP | 2098527 | 9/2009 |
| EP | 2254171 | 11/2010 |
| GB | 2449023 | 6/2011 |
| JP | 2009-524226 | 6/2009 |
| JP | 2009 203447 | 9/2009 |
| JP | 2009-215546 | 9/2009 |
| JP | 2009-246140 | 10/2009 |
| JP | 2010-123951 | 6/2010 |
| JP | 2010-271654 | 12/2010 |
| JP | 2012-004192 | 1/2012 |
| KR | 20110068665 | 6/2011 |
| WO | WO 2004/102690 | 11/2004 |
| WO | WO 2005/055248 | 6/2005 |
| WO | WO 2007/078993 | 7/2007 |
| WO | WO 2007/082584 | 7/2007 |
| WO | WO 2008/107089 | 9/2008 |
| WO | WO 2008/128618 | 10/2008 |
| WO | WO 2010/136112 | 12/2010 |
| WO | WO 2010/149258 | 12/2010 |
| WO | WO 2010/149261 | 12/2010 |
| WO | WO 2011/009522 | 1/2011 |
| WO | WO 2012/052704 | 4/2012 |
| WO | WO 2012/052713 | 4/2012 |
| WO | WO 2012/160382 | 11/2012 |
| WO | WO 2012/160383 | 11/2012 |
| WO | WO 2012/164282 | 12/2012 |

OTHER PUBLICATIONS

Database CA [Online] Chemical Abstracts Service, Columbus, Ohio, US; Jun. 28, 2011 (Jun. 28, 2011), CHO, Nam Seong et al., "Anthracene-based copolymers for organic thin film transistors with good hole mobility and on/off ratio," XP002697861, retrieved from STN Database accession No. 2011:802523; KR 2011 068-665 A (LG Display Co., Ltd., S. Korea) Jun. 22, 2011.

Holland et al, "Effects of order and disorder on field-effect mobilities measured in conjugated polymer thin-film transistors," *J. Appl. Phys.*, 75:7954, 1994.

Jiang et al., "Anthradithiophene-Containing Copolymers for Thin-Film Transistors and Photovoltaic Cells," *Macromolecules*, 43(15):6361-6367, 2010.

Okamoto et al., "Synthesis and Characterization of Pentacene- and Anthradithiophene-Fluorene Conjugated Copolymers Synthesized by Suzuki Reactions," *Macromolecules*, 41(19):6977-6980, 2008.

Osaka et al., "High-mobility semiconducting naphthodithiophene copolymers," *Journal of the American Chemical Society*, 132(14):5000-5001, 2010.

Payne et al., "Robust, soluble pentacene ethers," *Organic Letters*, 6(10):1609-1612, 2004.

Payne et al., "Stable, crystalline acenedithiophenes with up to seven linearly fused rings," *Organic Letters*, 6(19):3325-3328, 2004.

PCT International Search Report and Writen Opinion issued in International Patent Application No. PCT/GB2013/050461, dated Jun. 24, 2013.

PCT International Search Report and Written Opinion issued in International Patent Application No. PCT/GB2013/050457, dated Jul. 4, 2013.

PCT International Search Report and Written Opinion issued in International Patent Application No. PCT/GB2013/050458, dated Jul. 4, 2013.

PCT International Search Report and Written Opinion issued in International Patent Application No. PCT/GB2013/050459, dated Jul. 4, 2013.

(56) References Cited

OTHER PUBLICATIONS

PCT International Search Report and Written Opinion issued in International Patent Application No. PCT/GB2013/050460, dated Jun. 24, 2013.
PCT International Search Report and Written Opinion issued in International Patent Application No. PCT/GB2013/050462, dated Jun. 24, 2013.
PCT International Search Report and Written Opinion issued in International Patent Application No. PCT/GB2013/050463, dated Oct. 22, 2013.
Shinamura et al., "Air-Stable and High-Mobility Organic Semiconductors Based on Heteroarenes for Field-Effect Transistors," *Heterocycles*, 83(6):1187-1204, 2011.
Smith et al., "High-performance organic integrated circuits based on solution processable polymer-small molecule blends," *Applied Physics Letters*, 93(25): 253301, 2008.
Zheltov et al, "Investigations in the region of aromatic disulfides. X. Synthesis and properties of 2,2'-disulfide and its derivatives" *Zh. Org. Khim*, 16(2):384-390, 1980. (English translation of Russian text).
Zherdeva et al., "Investigation of the products from the reduction of 2,2'-stilbenedisulfonyl chloride by hydriodic acid," *Zh. Org. Khim*, 16(2):425-429, 1980. (English translation of Russian text).
Zherdeva et al., "Synthesis and transformations of 2,7-disubstituted benzothieno[3,2-b]benzothiophenes," *Zh. Org. Khim*, 16(2):430-438, 1980. (English translation of Russian text).
Office Communication issued in Chinese Patent Application No. 201380015974.0, dated Nov. 8, 2016. (English translation of Chinese text).
Office Communication issued in European Patent Application No. 13706698.1, dated Apr. 28, 2017.
Office Communication issued in Japanese Patent Application No. 2014-558217, dated Feb. 28, 2017. (English translation of Japanese text).
Office Communication issued in Japanese Patent Application No. 2014-558218, dated Feb. 28, 2017. (English translation of Japanese text).
Anonymous, "Polymer analysis by GPC-SEC Introduction," Agilent Technologies, 8 pages, 2000.
Balandier et al., "Anthradithiophene Derivatives Substituted at the 2,8-Positions by Formyl and Triphenylamine Units: Synthesis, Optical, and Electrochemical Properties," *Eur. J. Org. Chem.*, 17:3131-3136, 2011.
Office Communication issued in European Patent Application No. 13706699.9, dated Apr. 21, 2017.
Office Communication issued in European Patent Application No. 13706700.5, dated Sep. 1, 2017.
Office Communication issued in U.S. Appl. No. 14/379,773, dated Jun. 23, 2017.
Office Communication issued in U.S. Appl. No. 14/379,773, dated Feb. 24, 2017.
Office Communication issued in U.S. Appl. No. 14/379,773, dated Sep. 13, 2016.
Office Communication issued in U.S. Appl. No. 14/379,776, dated Nov. 6, 2017.
Office Communication issued in U.S. Appl. No. 14/379,776, dated Aug. 21, 2017.
Office Communication issued in U.S. Appl. No. 14/379,776, dated Apr. 12, 2017.
Office Communication issued in U.S. Appl. No. 14/379,776, dated Sep. 1, 2016.
Office Communication issued in U.S. Appl. No. 14/379,780, dated Oct. 4, 2016.
Office Communication issued in U.S. Appl. No. 14/379,780, dated Jan. 31, 2017.
Office Communication issued in U.S. Appl. No. 14/379,780, dated May 11, 2017.
Office Communication issued in U.S. Appl. No. 14/379,780, dated Jul. 24, 2017.
Office Communication issued in U.S. Appl. No. 14/379,780, dated Nov. 17, 2017.
Office Communication issued in U.S. Appl. No. 14/379,785, dated Sep. 14, 2016.
Office Communication issued in U.S. Appl. No. 14/379,785, dated Feb. 23, 2017.
Office Communication issued in U.S. Appl. No. 14/379,785, dated Sep. 28, 2017.
Office Communication issued in U.S. Appl. No. 14/379,790, dated Sep. 14, 2016.
Office Communication issued in U.S. Appl. No. 14/379,790, dated Feb. 24, 2017.
Office Communication issued in U.S. Appl. No. 14/379,790, dated Sep. 28, 2017.
Office Communication issued in U.S. Appl. No. 14/379,801, dated Feb. 18, 2016.
Office Communication issued in U.S. Appl. No. 14/379,801, dated Jul. 28, 2016.
Office Communication issued in U.S. Appl. No. 14/379,801, dated Apr. 20, 2017.
Office Communication issued in U.S. Appl. No. 14/379,801, dated Oct. 11, 2017.
Wenzel, Ulrike, "Charakterisierung eines ultrahochmolekularen Polymethacrylats mit flüssigkristalliner Seitengruppe in verdünnter Lösung," Dissertation, Technical University of Berlin, 2000.

\* cited by examiner

POLYCYCLIC AROMATIC HYDROCARBON POLYMERS AND THEIR USE AS ORGANIC SEMICONDUCTORS

This application is a national phase application under 35 U.S.C. § 371 of International Application No. PCT/GB2013/050462, filed Feb. 25, 2013, which claims the benefit of priority to United Kingdom Patent Application No. 1203159.7, filed Feb. 23, 2012. The entire contents of the above-referenced disclosures are specifically incorporated herein by reference.

FIELD OF THE INVENTION

The present invention relates to organic copolymers and organic semiconducting compositions comprising these materials, including layers and devices comprising such organic semiconductor compositions. The invention is also concerned with methods of preparing such organic semiconductor compositions and layers and uses thereof. The invention has application in the field of printed electronics and is particularly useful as a semiconducting material for use in formulations for organic field effect transistor (OFET) backplanes for displays, integrated circuits, organic light emitting diodes (OLEDs), photodetectors, organic photovoltaic (OPV) cells, sensors, memory elements and logic circuits.

BACKGROUND OF THE INVENTION

In recent years, there has been an increasing interest in organic semiconducting materials as an alternative to conventional silicon-based semiconductors. Organic semiconducting materials have several advantages over those based on silicon, such as lower cost, easier manufacturing, solution processability at low temperatures as well as increased flexibility, mechanical robustness, good compatibility with a wide variety of flexible substrates and light weight. They thus offer the possibility of producing more convenient high performance electronic devices.

Polyacene compounds and their analogues in particular have shown promise in this field of technology. WO 2005/055248 for example, discloses an organic semiconducting layer formulation comprising an organic binder which has a permittivity ($\varepsilon$) at 1000 Hz of 3.3 or less, and a polyacene compound. However the method for preparing the OFETs described in WO 2005/055248 in practice is limited and is only useful for producing top gate OFETs having relatively long channel lengths (typically >50 microns). A further disadvantage of WO 2005/055248 that is overcome by the present invention, is that it frequently uses undesirable chlorinated solvents. The highest performance semiconductor compositions disclosed in WO 2005/055248 having mobilities ≥1.0 cm$^2$V$^{-1}$s$^{-1}$, incorporated 1,2-dichlorobenzene as the solvent (page 54, Table 5 and examples 14, 21 and 25). Moreover these solvents are not ones that would be industrially acceptable in a printing process and these are also damaging to the environment. Therefore it would be desirable to use more benign solvents for the manufacture of these semiconductor compositions.

Furthermore, it is generally thought that only polymer binders with a permittivity of less than 3.3 could be used since any polymers with a higher permittivity resulted in a very significant reduction in mobility values of the OFET device.

This reduction in mobility value can further be seen in WO 2007/078993 which discloses the use of 2,3,9,10-substituted pentacene compounds in combination with insulating polymers having a dielectric constant at 1000 Hz of greater than 3.3. These compounds are reported to exhibit mobility values of between 10$^{-2}$ and 10$^{-7}$ cm$^2$V$^{-1}$s$^{-1}$ which are too low to be industrially useful.

Therefore, the present invention seeks to provide organic semiconductor compositions, which overcome the above-mentioned problems, by providing solvent soluble, high mobility, high flexibility polycyclic aromatic hydrocarbon copolymers, especially heteroacene copolymers and heteroacene analogue copolymers having a tunable permittivity value and which exhibit high mobility values.

SUMMARY OF THE INVENTION

The copolymers and compositions of the invention are expected to produce soluble materials that, on deposition, afford flexible, non-brittle layers unlike layers made from solely small molecule compounds. The copolymers of this invention have significantly higher mobilities than typical semiconducting binders used in the field of printable electronics, such as the polytriarylamine class of semiconducting binders that have mobilities in the order of ~10$^{-6}$ to 10$^{-3}$ cm$^2$/Vs. The copolymers of the invention will be industrially useful in the fabrication of rollable and flexible electronic devices such as OTFT arrays for displays; large area printed sensors and printed logic. In particular, the semiconducting polymers of this invention will be useful in formulations for organic thin film transistors (OTFTs) having short channel lengths 30 microns and even ≤5 to 10 microns) that may be used as the backplane driver for electrophoretic displays, high resolution LCD and AMOLED displays.

The copolymers are also soluble in benign, non-chlorinated solvents, such as those typically used in printing.

The present invention also provides highly flexible, non-brittle, semiconducting films.

Polycyclic Aromatic Hydrocarbon Copolymers

Polycyclic Aromatic Hydrocarbon Copolymers (hereinafter PAHCs) according to the present invention comprise a mixture of at least one heteroacene monomer unit having the Formula (A) and at least one cis/trans-indenofluorene monomer unit having the Formula (B/B'):

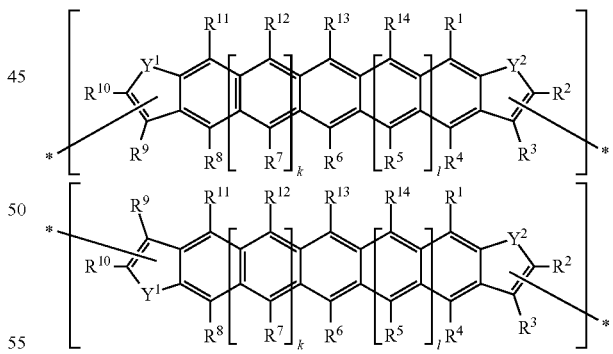

Formula (A)-represents the cis and/or trans isomers

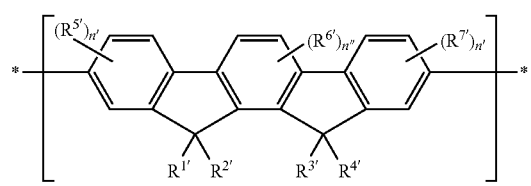

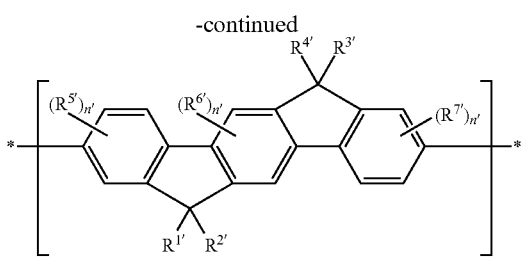

Formula (B/B')-represents cis and/or trans-indenofluorene isomers wherein monomers of Formula (A) can be the pure cis isomer, or the pure trans isomer, or a mixture of the cis and trans isomers.

$Y^1$ and $Y^2$ are independently O, S, Se or NR''''

R'''' is H or cyclic, straight-chain or branched $C_1$ to $C_{10}$ alkyl group, preferably H, k is 0 or 1 l is 0 or 1 wherein each of $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group; a $C_2$-$C_{10}$ alkynyl group substituted with a SiH$_2$R$^{22}$ group, a $C_2$-$C_{10}$ alkynyl substituted with a SiHR$^{22}$R$^{23}$ group, or a $C_2$-$C_{10}$ alkynyl substituted with a —Si(R$^{22}$)$_x$(R$^{23}$)$_y$(R$^{24}$)$_z$ group;

wherein each $R^{22}$ group is independently selected from the group consisting of a branched or unbranched, substituted or unsubstituted $C_1$-$C_{10}$ alkyl group, a branched or unbranched, substituted or unsubstituted $C_2$-$C_{10}$ alkynyl group, a substituted or unsubstituted $C_2$-$C_{20}$ cycloalkyl group, a substituted or unsubstituted $C_2$-$C_{10}$ alkenyl group, and a substituted or unsubstituted $C_6$-$C_{20}$ cycloalkylalkylene group;

each $R^{23}$ group is independently selected from the group consisting of a branched or unbranched, substituted or unsubstituted $C_1$-$C_{10}$ alkyl group, a branched or unbranched, substituted or unsubstituted $C_2$-$C_{10}$ alkynyl group, a substituted or unsubstituted $C_2$-$C_{10}$ alkenyl group, a substituted or unsubstituted $C_2$-$C_{20}$ cycloalkyl group, and a substituted or unsubstituted $C_6$-$C_{20}$ cycloalkylalkylene group;

$R^{24}$ is independently selected from the group consisting of hydrogen, a branched or unbranched, substituted or unsubstituted $C_2$-$C_{10}$ alkynyl group, a substituted or unsubstituted $C_2$-$C_{20}$ cycloalkyl group, a substituted or unsubstituted $C_6$-$C_{20}$ cycloalkylalkylene group, a substituted $C_5$-$C_{20}$ aryl group, a substituted or unsubstituted $C_6$-$C_{20}$ arylalkylene group, an acetyl group, a substituted or unsubstituted $C_3$-$C_{20}$ heterocyclic ring comprising at least one of O, N, S and Se in the ring;

wherein x=1 or 2; y=1 or 2; z=0 or 1; and (x+y+z)=3;

wherein each of $R^{15}$, $R^{16}$, $R^{18}$, $R^{19}$ and $R^{20}$ independently represent H or optionally substituted $C_1$-$C_{40}$ carbyl or hydrocarbyl group optionally comprising one or more heteroatoms;

wherein $R^{17}$ represents a halogen atom, H or optionally substituted $C_1$-$C_{40}$ carbyl or $C_1$-$C_{40}$ hydrocarbyl group optionally comprising one or more heteroatoms;

wherein at least two of $R^1$, $R^2$, $R^3$, $R^4$, $R^8$, $R^9$, $R^{10}$, and $R^{11}$ are a bond, represented by —*, to another monomer unit having the Formula (A) or (B/B'); and wherein monomer (B/B') is either the cis and/or trans-indenofluorene monomer and each $R^{1'}$, $R^{2'}$, $R^{3'}$, $R^{4'}$, $R^{5'}$, $R^{6'}$, $R^7$, each of which may be the same or different, is selected from the same group as $R^1$, $R^2$, $R^3$, $R^4$, $R^5$, $R^6$, and $R^7$ wherein preferably at least one of the groups, $R^{1'}$, $R^{2'}$, $R^{3'}$, $R^{4'}$, $R^{5'}$, $R^{6'}$ and $R^{7'}$ is a polar or polarising group and for the monomer group (B/B') —* represents a bond to another monomer unit having the Formula (A) or (B/B'); and wherein n'=1 to 3.

Preferably $R^2$=$R^{10}$ which represent H, F, Cl, Br, I, CN, optionally fluorinated or perfluorinated straight-chain or branched alkyl having 1 to 20, preferably 1 to 8 carbon atoms, optionally fluorinated or perfluorinated straight-chain or branched alkoxy having 1 to 20, preferably 1 to 8 carbon atoms, optionally fluorinated or perfluorinated aryl having 6 to 30 carbon atoms, preferably $C_6F_5$, or CO$_2$R''';

wherein R''' represents H, optionally fluorinated $C_1$ to $C_{20}$ alkyl group, or optionally fluorinated $C_6$ to $C_{30}$ aryl group, preferably optionally fluorinated $C_6$ to $C_{20}$ aryl group.

Preferably, k=l=0 or 1.

Preferably k and l=0.

Preferably, x=2 and y=1.

Preferably when z=0, $R^{22}$ and $R^{23}$ together comprise a combination of (i) branched or unbranched, substituted or unsubstituted $C_1$-$C_8$ alkyl group(s) and (ii) branched or unbranched, substituted or unsubstituted $C_2$-$C_8$ alkenyl group(s).

Preferably, any of $R^{22}$, $R^{23}$ and $R^{24}$ may optionally be substituted with a halogen atom.

Particularly preferred PAHCs according to the present invention are shown in the following table:

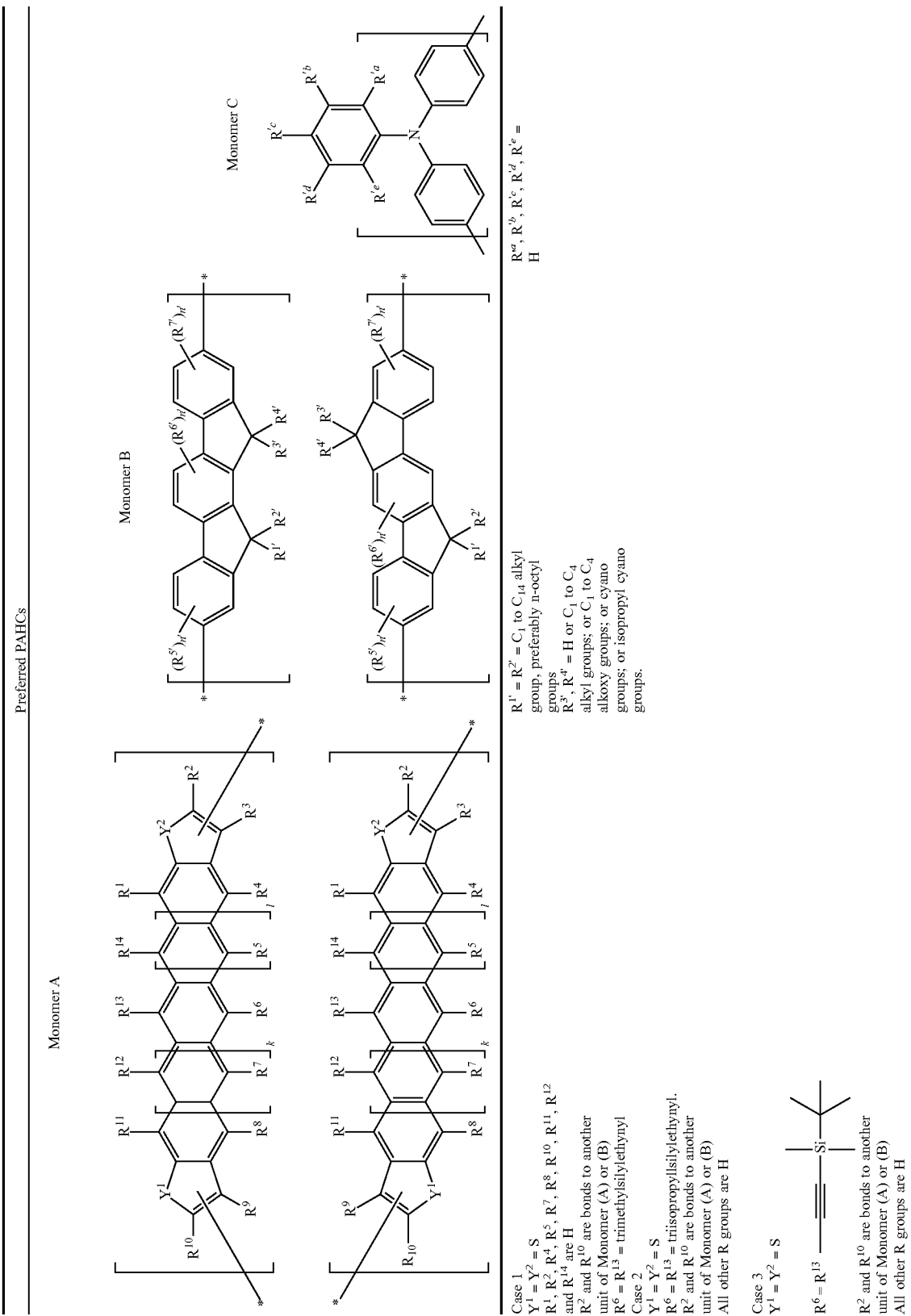

-continued

Preferred PAHCs

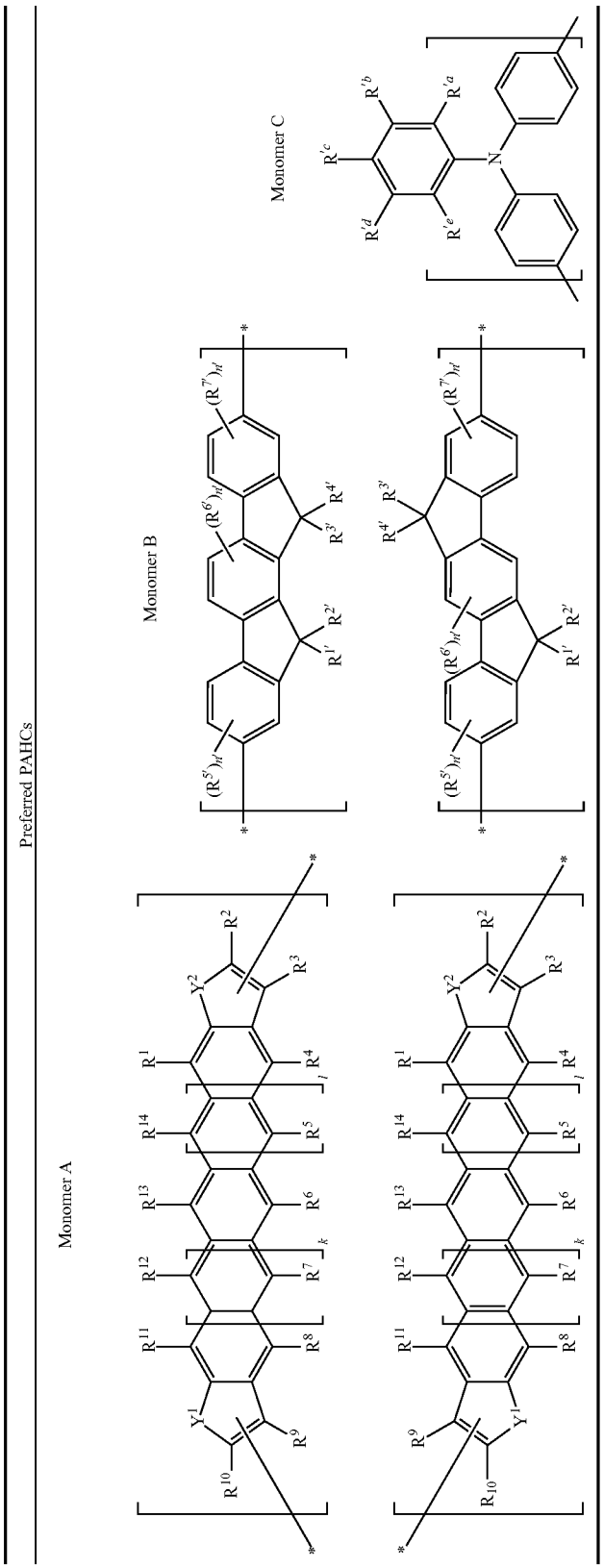

Monomer A

Monomer B

Monomer C

Case 4
$Y^1 = Y^2 = S$
$R^6 = R^{13}$ = triethylsilylethynyl
$R^2$ and $R^{10}$ are bonds to another unit of Monomer (A) or (B)
All other R groups are H
Case 5
$Y^1 = Y^2 = S$
$R^2$ and $R^{10}$ are bonds to another unit of Monomer (A) or (B)
All other R groups are H
Case 6
$R^6 = R^{13} = $ 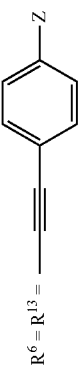

where $Z = C_1$-$C_5$ alkyl/branched alkyl (e.g. methyl or isopropyl)

Case 1
Case 2
Case 3

$R^{1'} = R^{2'} = C_1$ to $C_{14}$ alkyl group, preferably n-octyl groups $R'^b$, $R'^d$, $R'^e$ = H
$R'^a$ and $R'^c = C_1$ to $C_4$ alkyl

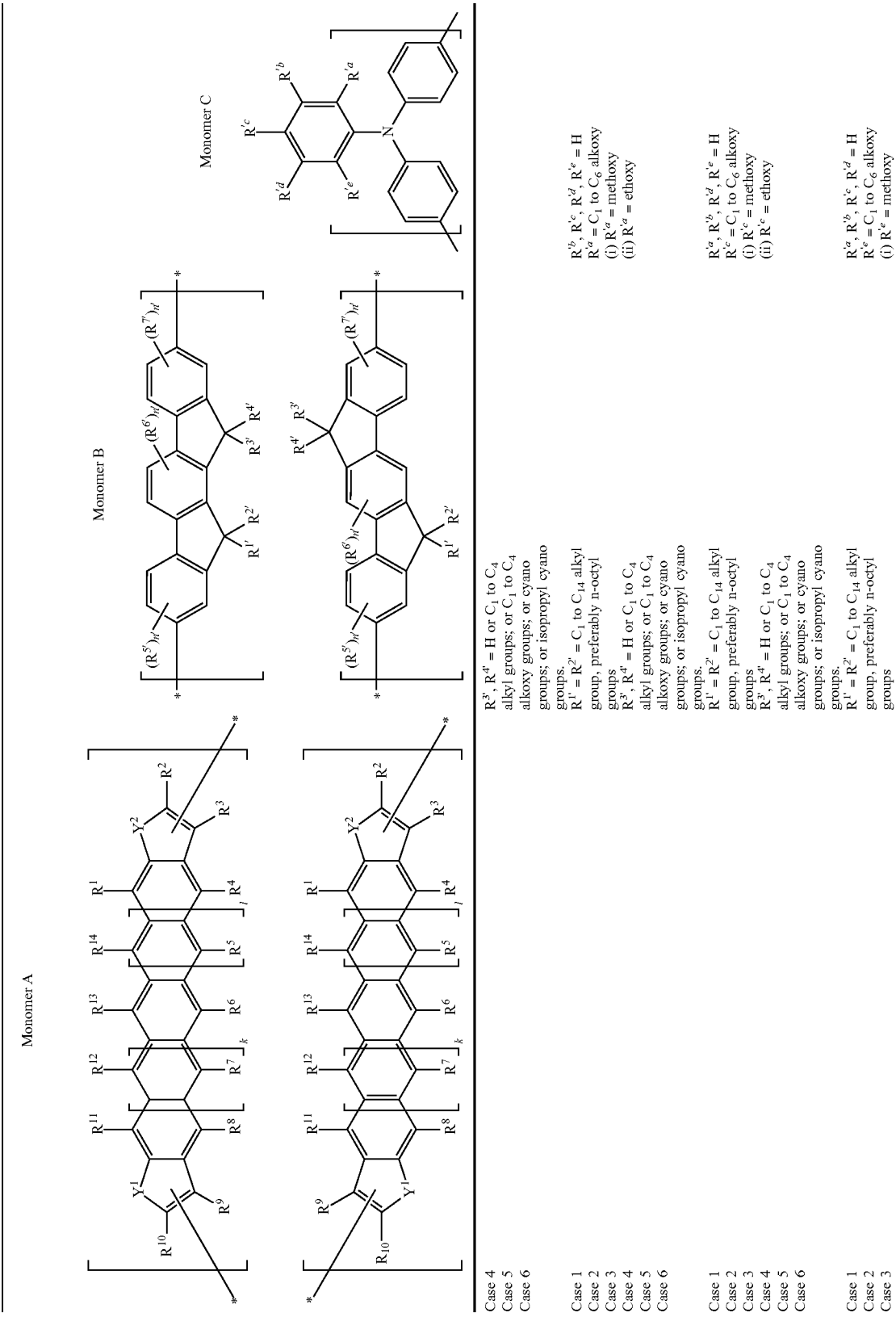

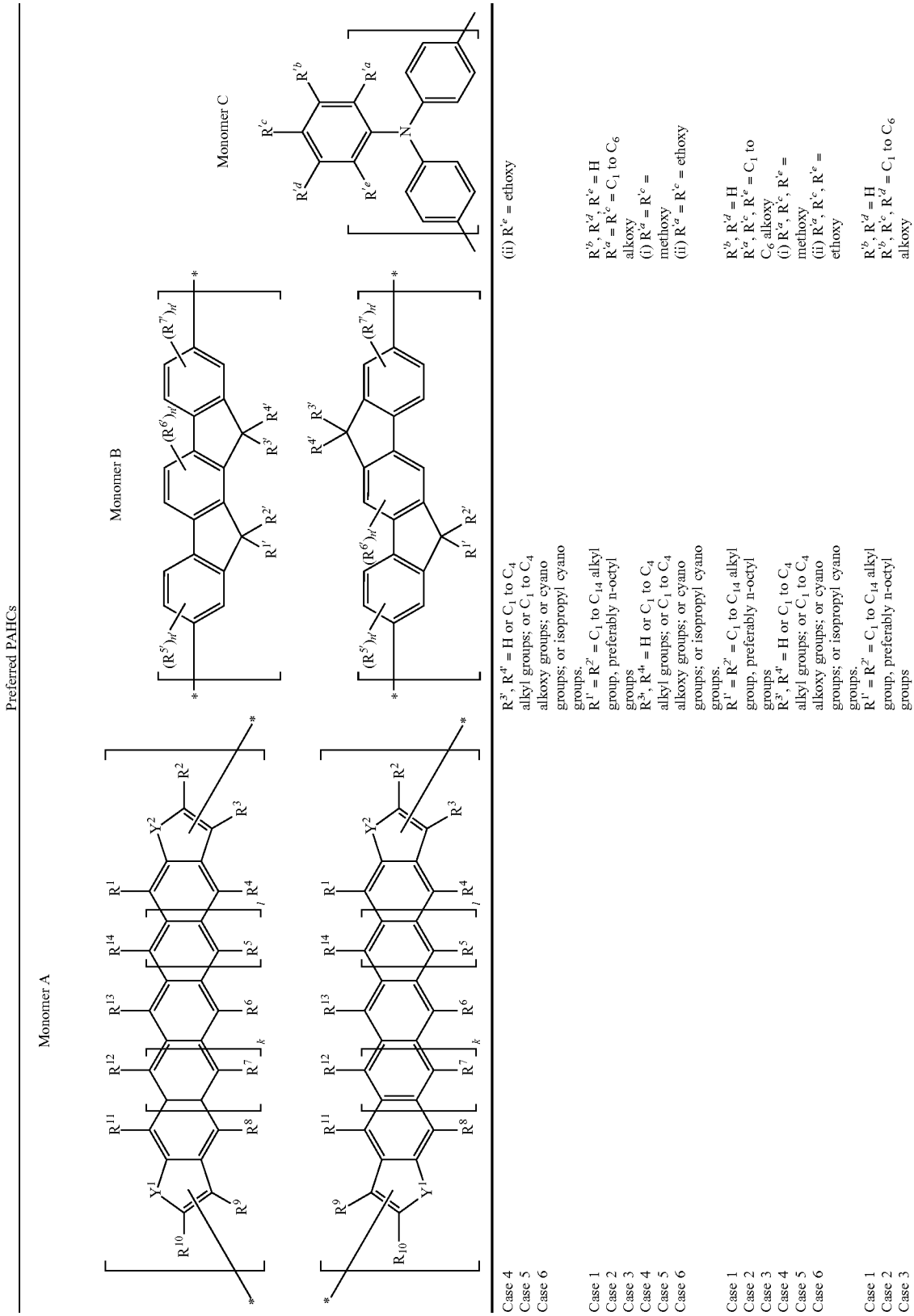

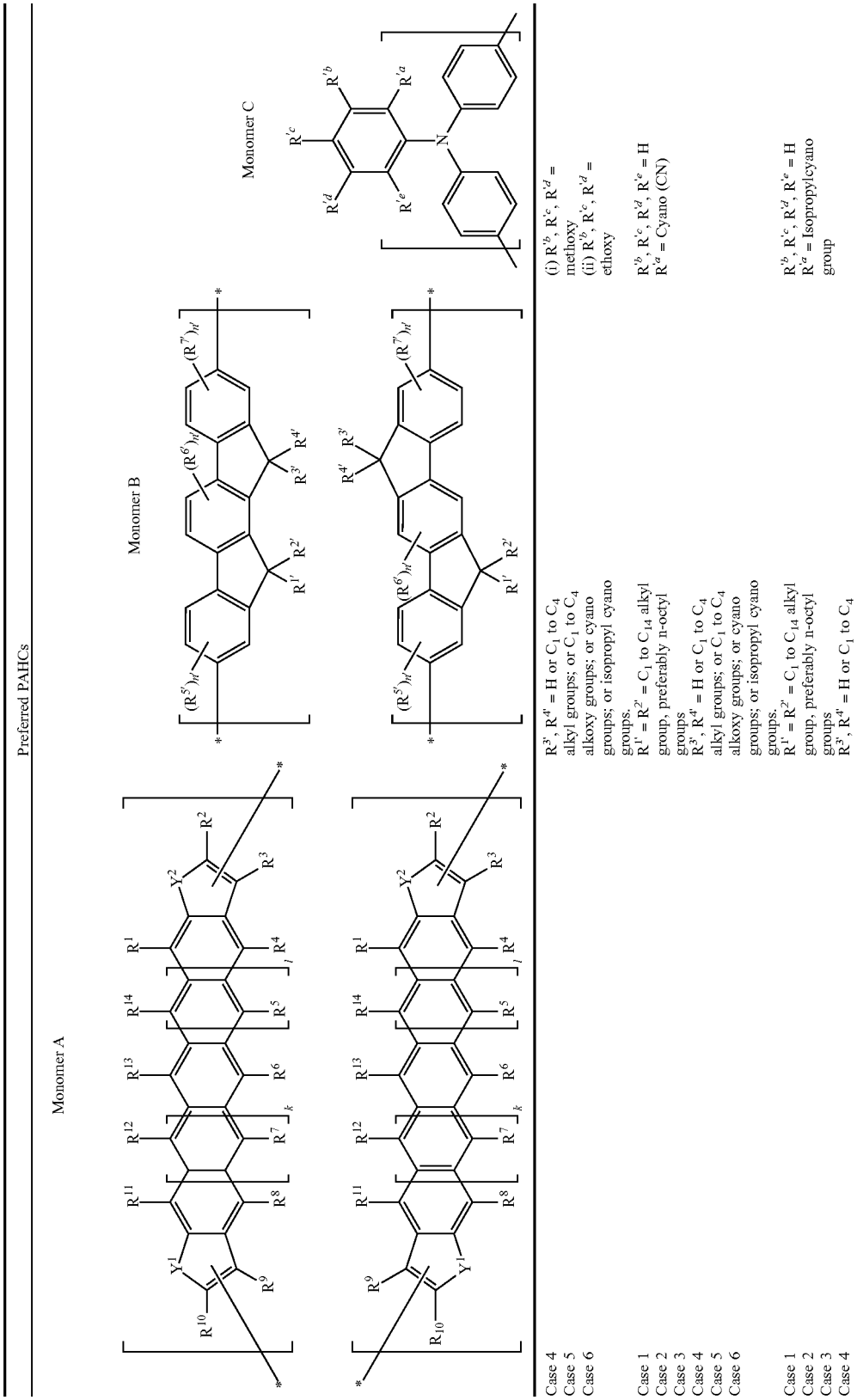

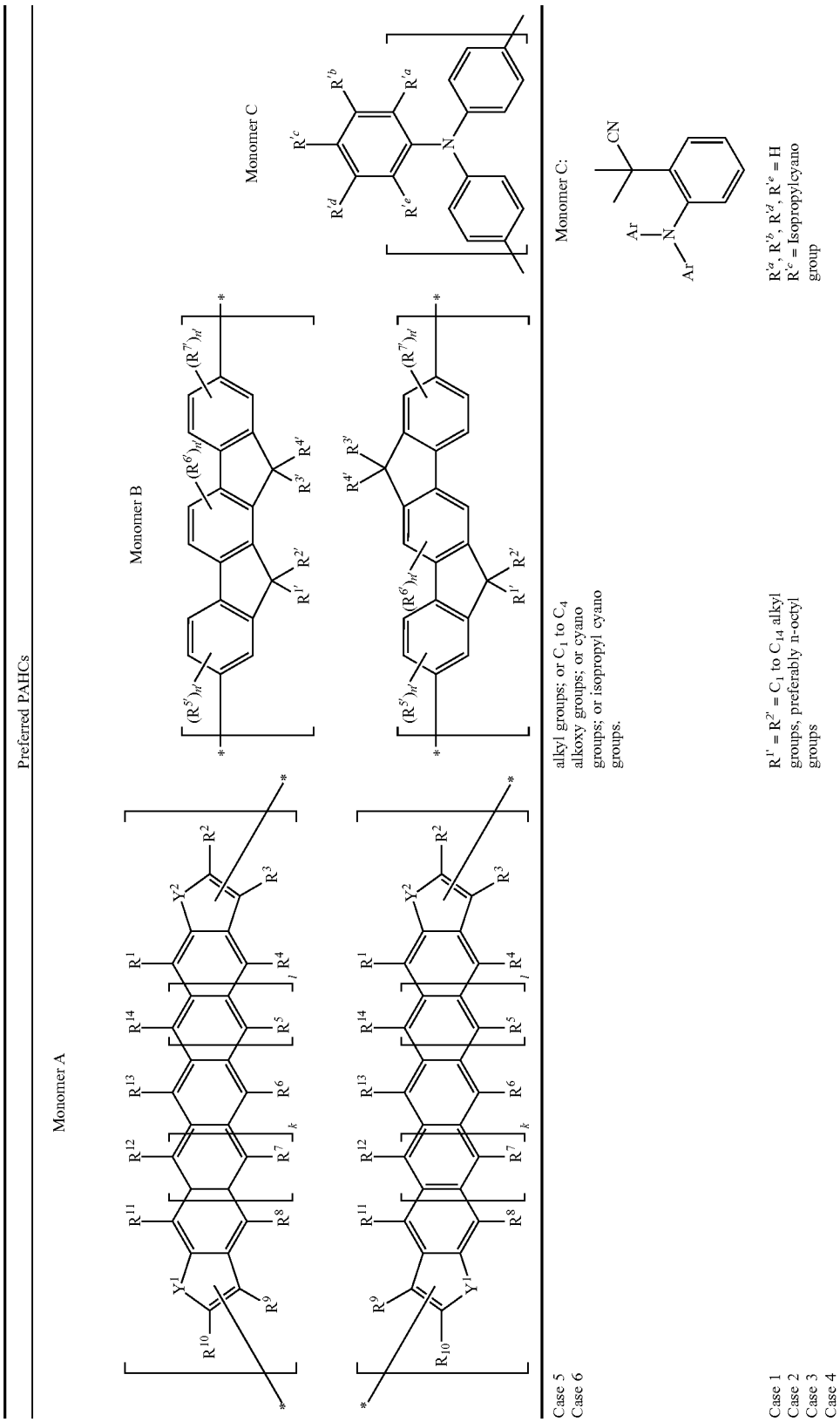

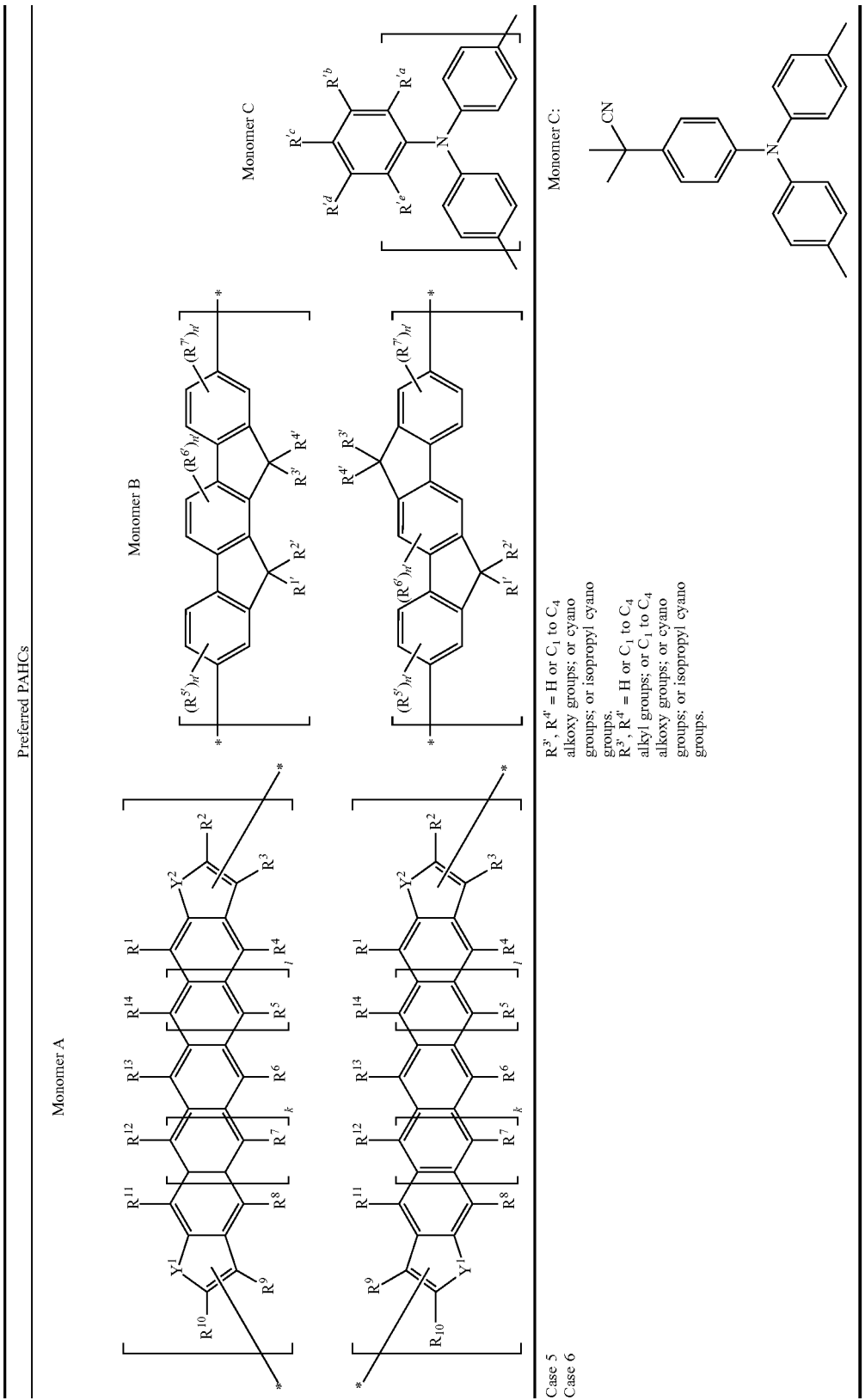

The organic semiconductors compounds specified in the table are particularly preferred as they combine the beneficial properties of high charge transport mobility (of the binders) with a polarity that is more compatible with benign, non-chlorinated solvents that will be desirable for use in large area printing. In addition, as these compounds are more polar once deposited as the OSC layer, or alternatively as a component in the OSC layer, they are expected to be resistant to being re-dissolved by the hydrophobic solvents used for the organic gate insulators (OGI) such as Cytop. Furthermore, it is expected that the polar binders are useful for both top gate and bottom gate OTFTs, particularly for bottom gate OTFTs.

The copolymers according to the present invention preferably have a number average molecular weight (Mn) of between 500 and 100,000, more preferably between 1600 and 20000, more preferably between 500 and 10000, even more preferably between 850 and 5000.

The copolymers according to the present invention preferably have between 1 and 100000 monomer units having the Formula (A) and between 1 and 100000 cis/trans-indenofluorene monomer units having the Formula (B/B'). More preferably, the copolymers have between 1 and 1000 monomer units having the Formula (A) and between 1 and 1000 cis/trans-indenofluorene monomer units having the Formula (B/B'). More preferably, the copolymers have between 1 and 100 monomer units having the Formula (A) and between 1 and 100 cis/trans-indenofluorene monomer units having the Formula (B/B'). Yet even more preferably, the copolymers have between 1 and 10 monomer units having the Formula (A) and between 1 and 10 cis/trans-indenofluorene monomer units having the Formula (B/B').

Preferably, the organic semiconductor compositions according to the present invention contain less than 10% by weight, more preferably less than 5% by weight, more preferably less than 1%, more preferably, substantially no organic binders which have a permittivity at 1000 Hz of less than 3.4.

Preferred PAHCs and compositions of the present invention contain at least 20 wt. %, more preferably at least 20-40 wt. % (of the total of all monomer units (A) and (B/B') in the copolymer or composition) of a heteroacene monomer unit having the Formula (A) and at least 20 wt. %, preferably at least 20-80 wt. %, more preferably at least 50 wt. %, and even more preferably at least 60-80 wt. % of a monomer unit having the Formula (B/B').

Preferred PAHCs and compositions of the present invention contain at least 40 wt. % (of the total of all monomer units (A) and (B/B') in the copolymer or composition) of a heteroacene monomer unit having the Formula (A) and at least 40 wt. %, preferably 60 wt. % of a monomer unit having the Formula (B/B'). Preferred PAHCs contain monomer unit (B/B') as the major component.

The heteroacene copolymers may be produced according to the following general synthetic regime. For simplicity, a bis(trialkyl)silyl substituted pentacene is shown (no further substitutions are shown, the skilled person understanding how this can be genericised to the structures shown above) being coupled to a cis/trans-indenofluorene monomer. The coupling reaction is preferably a Yamamoto type coupling (using Nickel chloride, zinc, 2,2'-bipyridyl, triphenylphosphine and dimethyl acetamide). However, Suzuki coupling is also possible, although in this case it is preferable to remove the boronic esters from the resulting semiconducting polymer.

General Synthesis Route to the PAHC

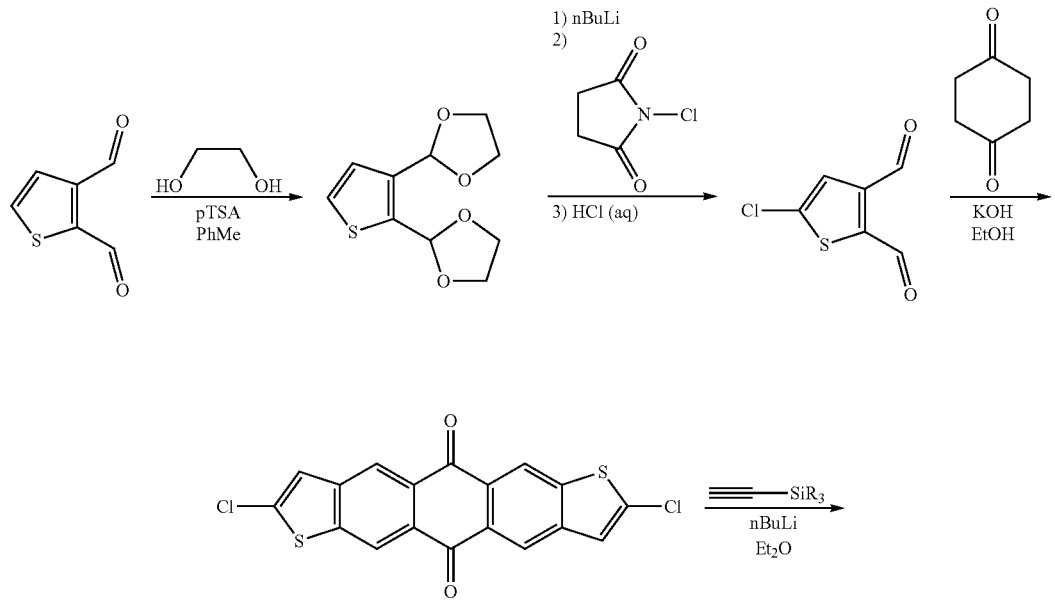

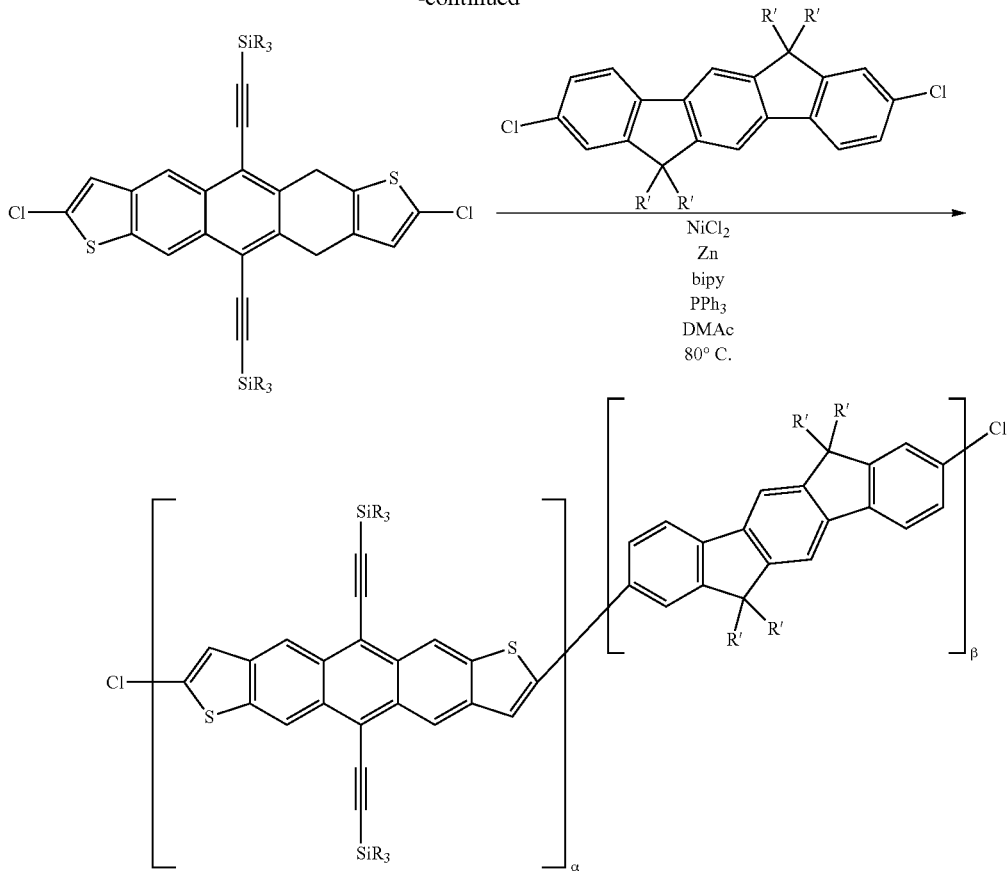

wherein α and β are preferably integers of 1-100000; R has the same definition as $R^{25}$, $R^{26}$ and $R^{27}$, as defined below; and R' has the same definition as for $R^{1'}$, $R^{2'}$, $R^{3'}$ and $R^{4'}$ wherein preferably at least one of $R^{1'}$, $R^{2'}$, $R^{3'}$, $R^{4'}$ is a polar or polarising group defined below. The halogen end groups are preferentially reacted either by substitution or hydrogentation.

Alternative Synthesis Route to the PAHC

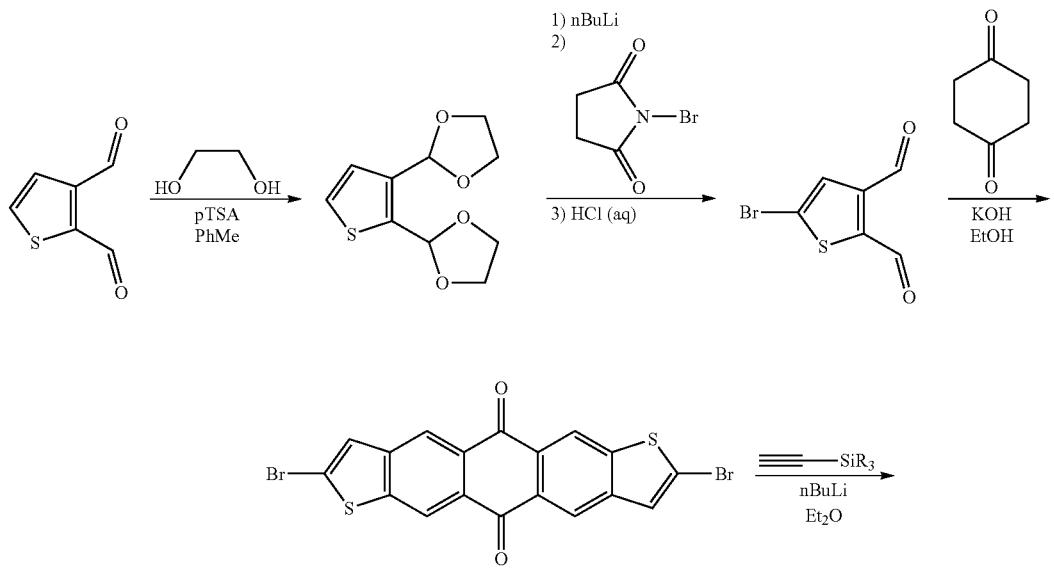

-continued

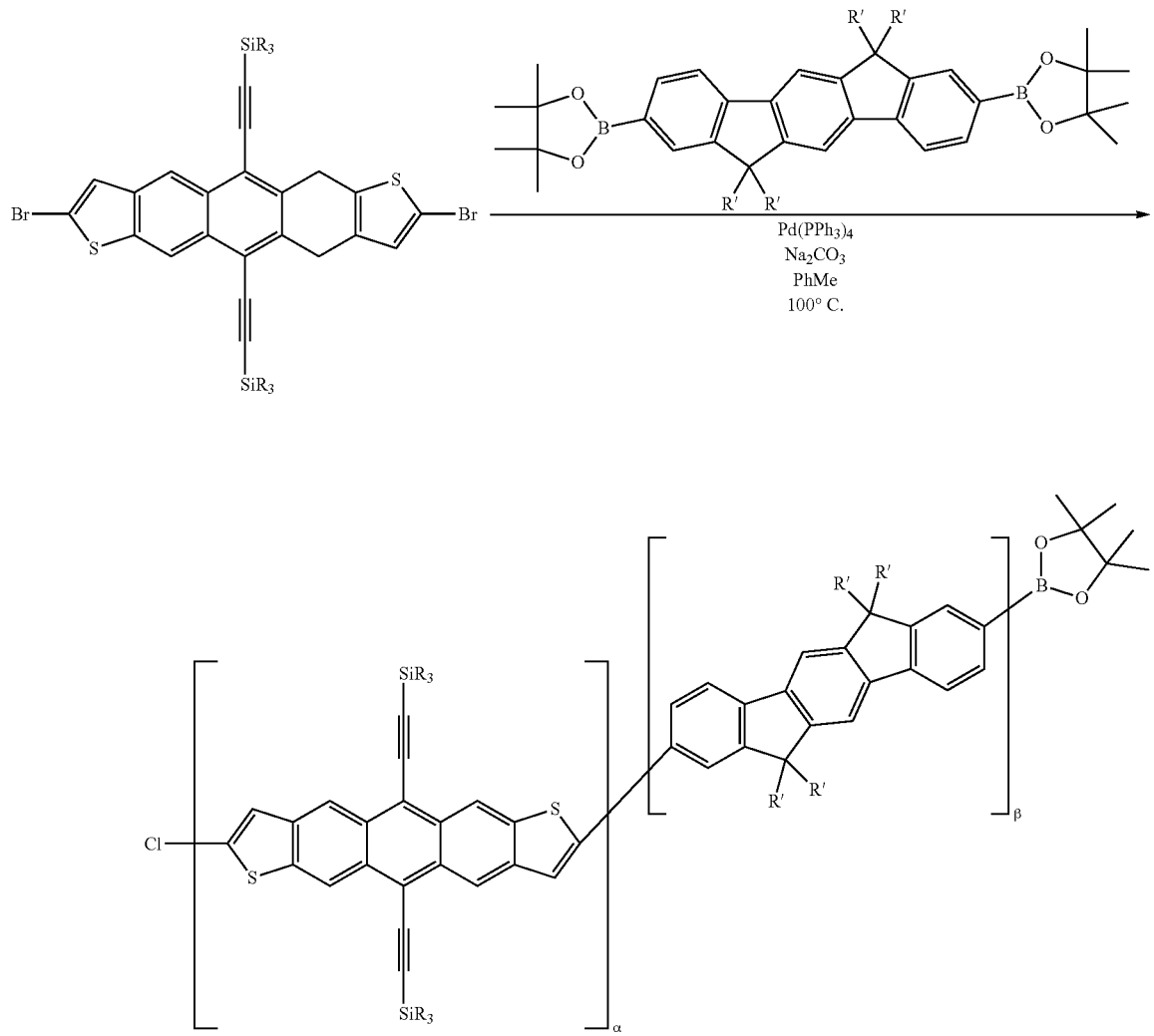

wherein α and β are preferably integers of 1-100000; and R has the same definition as $R^{25}$, $R^{26}$ and $R^{27}$, as defined below; and R' has the same definition as for $R^{1'}$, $R^{2'}$, $R^3$ and $R^{4'}$ wherein preferably at least one of $R^{1'}$, $R^{2'}$, $R^{3'}$, $R^{4'}$ is a polar or polarising group defined below. On completion of the coupling reaction, the halogen and boronic ester end groups are preferably substituted by other groups, for example by hydrogenation and/or hydrolysis respectively.

Following the polymerization step to form the copolymer of the present invention, the copolymer may be cross-linked. Cross-linking may be achieved by any known technique. Examples include the application of heat and/or moisture, ethylene oxide treatment, UV irradiation, gamma sterilisation, electron beam irradiation, and autoclaving.

Thus, according to another aspect of the present invention, there is provided a process for producing a Polycyclic Aromatic Hydrocarbon Copolymer (PAHC) comprising copolymerising a composition containing at least one heteroacene monomer unit selected from the structure A':

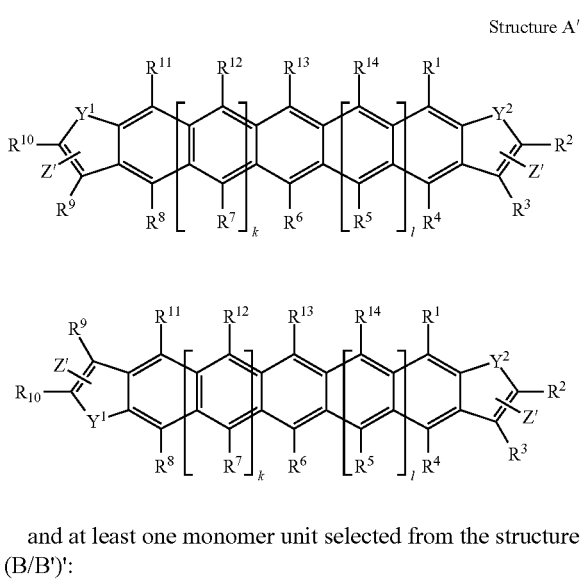

Structure A' and at least one monomer unit selected from the structure (B/B')':

Structure (B/B')'

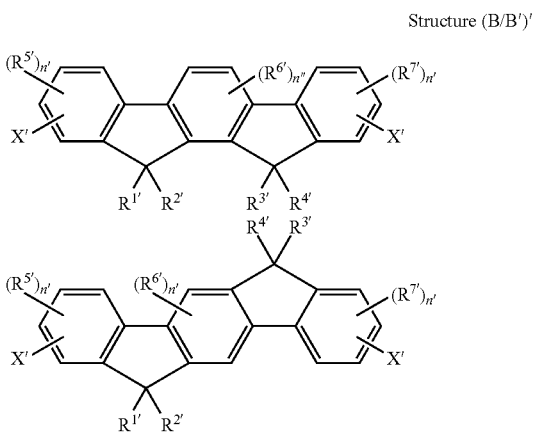

wherein each of R and R' groups, and k and l have the same general and preferred meanings as described in relation to the PAHC definitions above; wherein preferably at least one of and $R^{1'}$, $R^{2'}$, $R^{3'}$, $R^{4'}$, $R^{5'}$, $R^{6'}$, $R^{7'}$ is a polar group or more polarising group; and wherein X' is a halogen atom or a cyclic borate group; and
wherein Y' is a halogen atom.

Preferably, the cyclic borate group is

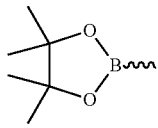

Preferably, the process is carried out in a solvent, preferably an organic solvent, preferably an aromatic organic solvent.

The compositions of the present invention can comprise additional curable monomers, for example, diluent monomers. Examples of suitable materials include radically curable monomer compounds, such as acrylate and methacrylate monomer compounds. Examples of acrylate and methacrylate monomers include isobornyl acrylate, isobornyl methacrylate, lauryl acrylate, lauryl methacrylate, isodecylacrylate, isodecylmethacrylate, caprolactone acrylate, 2-phenoxyethyl acrylate, isooctylacrylate, isooctylmethacrylate, butyl acrylate, alkoxylated lauryl acrylate, ethoxylated nonyl phenol acrylate, ethoxylated nonyl phenol methacrylate, ethoxylated hydroxyethyl methacrylate, methoxy polyethylene glycol monoacrylate, methoxy polyethylene glycol monomethacrylate, tetrahydrofurfuryl methacrylate, as well as mixtures or combinations thereof.

In addition, multifunctional acrylate and methacrylate monomers and oligomers can be included in the compositions as reactive diluents and as materials that can increase the crosslink density of the cured composition. Examples of suitable multifunctional acrylate and methacrylate monomers and oligomers include pentaerythritol tetraacrylate, pentaerythritol tetramethacrylate, 1,2-ethylene glycol diacrylate, 1,2-ethylene glycol dimethacrylate, 1,6-hexanediol diacrylate, 1,6-hexanediol dimethacrylate, 1,12-dodecanol diacrylate, 1,12-dodecanol dimethacrylate, tris(2-hydroxy ethyl)isocyanurate triacrylate, propoxylated neopentyl glycol diacrylate, hexanediol diacrylate, tripropylene glycol diacrylate, dipropylene glycol diacrylate, ethoxylated bisphenol A diacrylate, ethoxylated bisphenol A dimethacrylate, alkoxylated hexanediol diacrylate, alkoxylated cyclohexane dimethanol diacrylate, polyethylene glycol diacrylate, polyethylene glycol dimethacrylate, tris(2-hydroxy ethyl)isocyanurate triacrylate, amine modified polyether acrylates (available as PO 83 F®, LR 8869®, and/or LR 8889® (all available from BASF Corporation), trimethylolpropane triacrylate, glycerol propoxylate triacrylate, dipentaerythritol pentaacrylate, dipentaerythritol hexaacrylate, ethoxylated pentaerythritol tetraacrylate (available from Sartomer Co. Inc. as SR 494®), as well as mixtures and combinations thereof. When a reactive diluent is added to the composition of the present invention, the reactive diluent is added in any desired or effective amount, in one embodiment at least about 1 percent by weight of the carrier, at least about 35 percent by weight of the carrier, no more than about 98 percent by weight of the carrier, no more than about 75 percent by weight of the carrier, although the amount of diluent can be outside of these ranges.

Copolymers according to the present invention may have a permittivity at 1000 Hz of greater than 1.5, preferably greater than 2, preferably greater than 3. Particularly preferably, copolymers according to the present invention are semiconducting copolymers having a permittivity at 1000 Hz of between 1.5 and 8, more preferably between 3.4 and 8. In a preferred embodiment, the polyacene copolymers have a permittivity at 1000 Hz of between 3.4 and 7, more preferably between 3.4 and 6.5, yet more preferably between 3.4 and 4.5 and even more preferably between 3.4 and 4.0. Copolymers according to the present invention are preferably semiconducting copolymers and may have a permittivity at 1000 Hz of greater than 3.4, for example greater than 3.8, greater than 4.0, greater than 4.2 and the like.

Preferably, the organic semiconductor compositions according to the present invention contain less than 10% by weight, more preferably less than 5% by weight, more preferably less than 1% by weight, more preferably, substantially no copolymers which have a permittivity at 1000 Hz of less than 3.4. In a preferred embodiment, the permittivity is determined by the method disclosed in WO 2004/102690 or by using the method disclosed herein, preferably by using the method disclosed herein.

Preferably, the copolymers of the present invention are semiconducting copolymers having a permittivity at 1000 Hz of between 3.4 and 8. In a preferred embodiment, the copolymers have a permittivity at 1000 Hz of between 3.4 and 7, more preferably between 3.4 and 6.5, and even more preferably between 3.4 and 4.5. The permittivity of the copolymers can be measured using any standard method known to those skilled in the art. In a preferred embodiment, the permittivity is determined by the method disclosed in WO 2004/102690 or by using the method disclosed herein, preferably by using the method disclosed herein.

Monomer Units of Formula (A)

The following are some preferred characteristics of the heteroacene monomer units defined above as (A).

In a preferred embodiment, at least one (and more preferably 2) of groups $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are tri-$C_{1-20}$ hydrocarbylsilyl $C_{1-4}$ alkynyl groups.

Preferably at least one (and more preferably 2) of groups $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are trihydrocarbylsilyl ethynyl groups.

In a preferred embodiment, at least one (and more preferably 2) of groups $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are (trihydrocarbylsilyl)ethynyl-groups, —C≡C—$SiR^{22}R^{23}R^{24}$, wherein $R^{22}$, $R^{23}$ and $R^{24}$ independently represent $C_1$-$C_6$ alkyl or $C_2$-$C_6$ alkenyl. In a more preferred embodiment, $R^{22}$, $R^{23}$ and $R^{24}$ are independently selected from the group consisting of methyl, ethyl, propyl, isopropyl, n-butyl, isobutyl, t-butyl, 1-propenyl and 2-propenyl.

In a preferred embodiment, $R^6$ and $R^{13}$ are trialkylsilyl ethynyl groups, —C≡C—SiR$^{22}$R$^{23}$R$^{24}$, wherein $R^{22}$, $R^{23}$ and $R^{24}$ independently represent $C_1$-$C_6$ alkyl or $C_2$-$C_6$ alkenyl. In a more preferred embodiment, $R^{22}$, $R^{23}$ and $R^{24}$ are independently selected from the group consisting of methyl, ethyl, propyl, isopropyl, n-butyl, isobutyl, t-butyl 1-propenyl and 2-propenyl.

In yet another preferred embodiment, when k=l=0; $R^1$, $R^2$, $R^3$, $R^4$, $R^8$, $R^9$, $R^{10}$ and $R^{11}$ independently represent H, $C_1$-$C_6$ alkyl or $C_1$-$C_6$ alkoxy. More preferably, $R^1$, $R^4$, $R^8$ and $R^{11}$ are the same and represent H, $C_1$-$C_6$ alkyl or $C_1$-$C_6$ alkoxy. In an even more preferred embodiment, $R^1$, $R^2$, $R^3$, $R^4$, $R^8$, $R^9$, $R^{10}$ and $R^{11}$ are the same or different and are selected from the group consisting of hydrogen, methyl, ethyl, propyl, n-butyl, isobutyl, t-butyl, methoxy, ethoxy, propyloxy and butyloxy.

Preferably, $R^1$, $R^3$, $R^4$, $R^8$, $R^9$ and $R^{11}$ are hydrogen.

Preferably, $R^{22}$, $R^{23}$ and $R^{24}$ are independently selected from the group consisting hydrogen, a $C_1$-$C_{10}$ alkyl group (preferably $C_1$-$C_4$-alkyl and most preferably methyl, ethyl, n-propyl or isopropyl) which may optionally be substituted for example with a halogen atom.

$R^{22}$ and $R^{23}$ are preferably independently selected from the group consisting optionally substituted $C_{1-10}$ alkyl group and optionally substituted $C_{2-10}$ alkenyl, more preferably $C_1$-$C_6$ alkyl or $C_2$-$C_6$ alkenyl. A preferred alkyl group in this case is isopropyl.

Examples of the silyl group —Si(R$^{22}$)$_x$(R$^{23}$)$_y$(R$^{24}$)$_z$ include, without limitation, trimethylsilyl, triethylsilyl, tripropylsilyl, dimethylethylsilyl, diethylmethylsilyl, dimethylpropylsilyl, dimethylisopropylsilyl, dipropylmethylsilyl, diisopropylmethylsilyl, dipropylethylsilyl, diisopropylethylsilyl, diethylisopropylsilyl, triisopropylsilyl, trimethoxysilyl, triethoxysilyl, triphenylsilyl, diphenylisopropylsilyl, diisopropylphenylsilyl, diphenylethylsilyl, diethylphenylsilyl, diphenylmethylsilyl, triphenoxysilyl, dimethylmethoxysilyl, dimethylphenoxysilyl, methylmethoxyphenyl, etc. For each example in the foregoing list, the alkyl, aryl or alkoxy group may optionally be substituted.

In a preferred embodiment of the first aspect of the invention, PAHCs according to the present invention comprise at least one monomer unit having the Formula (A1):

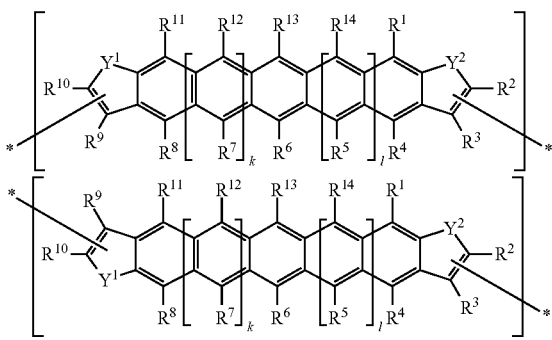

Formula (A1)

-cis and/or trans isomers wherein each of $R^1$, $R^4$, $R^8$ and $R^{11}$ are hydrogen;

$R^6$ and $R^{13}$ are trialkylsilyl ethynyl groups, —C≡C—SiR$^{22}$R$^{23}$R$^{24}$, wherein $R^{22}$, $R^{23}$ and $R^{24}$ independently represent $C_1$-$C_4$ alkyl or $C_2$-$C_4$ alkenyl;

$R^1$, $R^4$, $R^8$ and $R^{11}$ are independently selected from the group consisting of hydrogen; a branched or unbranched, unsubstituted $C_1$-$C_4$ alkyl group; $C_1$-$C_6$ alkoxy group and $C_6$-$C_{12}$ aryloxy group;

Provided that at least one of each pair of $R^2/R^3$ and $R^9/R^{10}$ are a bond, represented by —*, to another monomer unit having the Formula (A), (A1) or (B/B') and wherein k and l are independently 0, or 1, preferably both k and l are 0.

In monomer units of Formula (A1), wherein k and l are both 0; $R^6$ and $R^{13}$ are (trialkylsilyl)ethynyl groups, —C≡C—SiR$^{22}$R$^{23}$R$^{24}$, wherein $R^{22}$, $R^{23}$ and $R^{24}$ are preferably selected from ethyl, n-propyl, isopropyl, 1-propenyl or 2-propenyl; $R^1$, $R^2$, $R^3$, $R^4$, $R^8$, $R^9$, $R^{10}$ and $R^{11}$ are independently selected from the group consisting of hydrogen, methyl, ethyl and methoxy, provided that at least one of each pair of $R^a/R^3$ and $R^b/R^9$ are a bond, represented by —*, to another monomer unit having the Formula (A), (A1) or (B/B').

In a more preferred embodiment the heteroacene moiety in the PAHC copolymer is a substituted heteroacene, wherein each $R^{22}$ group is independently selected from the group consisting of a branched or unbranched, substituted or unsubstituted $C_1$-$C_8$ alkyl group, a substituted or unsubstituted $C_2$-$C_{12}$ cycloalkyl group, and a substituted or unsubstituted $C_6$-$C_{12}$ cycloalkylalkylene group; each $R^{23}$ group is independently selected from the group consisting of a substituted or unsubstituted $C_2$-$C_8$ alkenyl group, a substituted or unsubstituted $C_2$-$C_{12}$ cycloalkyl group, and a substituted or unsubstituted $C_6$-$C_{12}$ cycloalkylalkylene group; and $R^{24}$ is independently selected from the group consisting of hydrogen, a branched or unbranched, substituted or unsubstituted $C_2$-$C_8$ alkynyl group, a substituted or unsubstituted $C_2$-$C_{12}$ cycloalkyl group, a substituted or unsubstituted $C_6$-$C_{12}$ cycloalkylalkylene group, a substituted $C_5$-$C_{12}$ aryl group, a substituted or unsubstituted $C_6$-$C_{14}$ arylalkylene group, an acetyl group, a substituted or unsubstituted $C_5$-$C_{12}$ heterocyclic ring comprising at least one of O, N, S and Se in the ring.

Preferred PAHCs and compositions of the present invention contain at least 20 wt. % (of the total of all monomer units (A), (A1) and (B/B'), in the copolymer or composition) of a heteroacene monomer unit having the Formula (A1) and at least 20 wt. %, preferably between 20-80 wt. % of a monomer unit having the Formula (B/B').

Especially preferred heteroacene monomer units according to the present invention are those of Formula (A2)

Formula (A2)

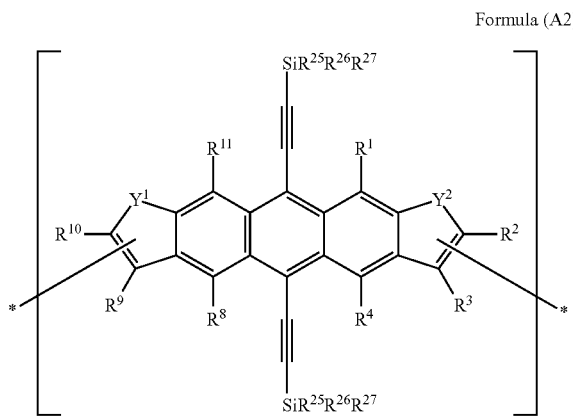

(A3)

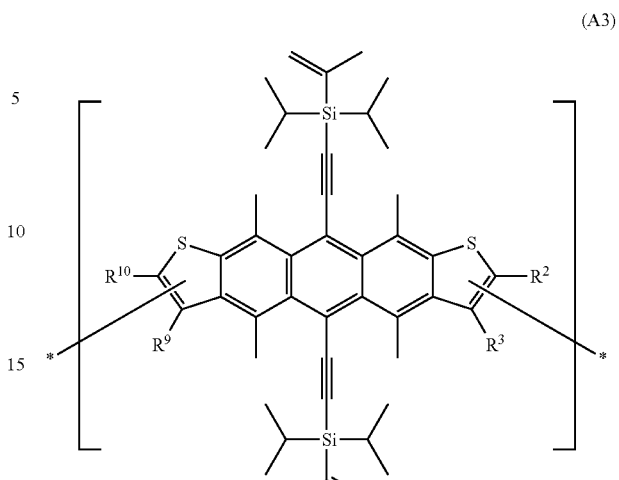

(A4)

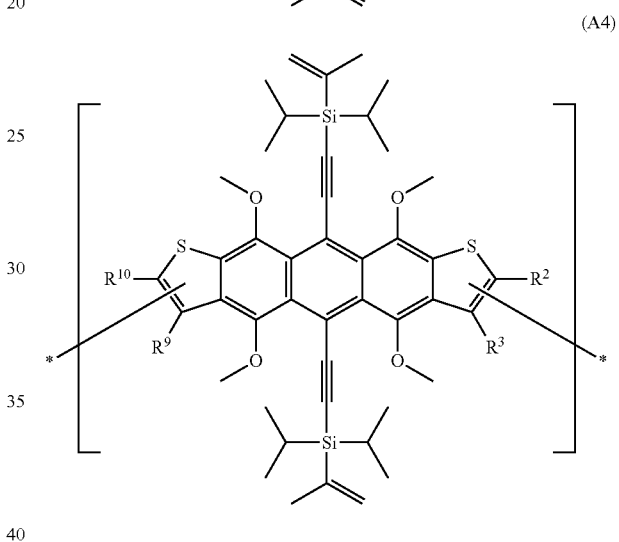

wherein $Y^1=Y^2=S$ and $R^1$, $R^4$, $R^8$ and $R^{11}$ are independently selected from the group consisting of H, $C_1$-$C_6$ alkyl and $C_1$-$C_6$ alkoxy.

Preferably $R^1$, $R^4$, $R^8$ and $R^{11}$ are the same or different and are independently selected from the group consisting of hydrogen, methyl, ethyl, propyl, n-butyl, isobutyl, t-butyl, methoxy, ethoxy, propyloxy and butyloxy, more preferably hydrogen, methyl, propyl and methoxy.

In monomer units of Formula (A2), $R^2$, $R^3$, $R^9$ and $R^{10}$ are independently selected from the group consisting of H, $C_1$-$C_6$ alkyl and $C_1$-$C_6$ alkoxy, provided that at least one of each pair of $R^2/R^3$ and $R^9/R^{10}$ are a bond, represented by —*, to another monomer unit having the Formula (A), (A1), (A2) or (B/B'). In a preferred embodiment, $R^2$, $R^3$, $R^9$ and $R^{10}$ are the same or different and are independently selected from the group consisting of hydrogen, methyl, ethyl, propyl, n-butyl, isobutyl, t-butyl, methoxy, ethoxy, propyloxy and butyloxy, more preferably hydrogen, methyl, ethyl, propyl and methoxy, provided that at least one of each pair of $R^2/R^3$ and $R^9/R^{10}$ are a bond, represented by —*, to another monomer unit having the Formula (A), (A1), (A2), or (B/B').

In monomer units of Formula (A2), $R^{25}$, $R^{26}$ and $R^{27}$ are independently selected from the group consisting of $C_1$-$C_6$ alkyl and $C_2$-$C_6$ alkenyl, preferably $R^{25}$, $R^{26}$ and $R^{27}$ are independently selected from the group consisting of methyl, ethyl, propyl, isopropyl, n-butyl, isobutyl, t-butyl, 1-propenyl and 2-propenyl, more preferably ethyl, n-propyl and isopropyl.

Preferred PAHCs and compositions of the present invention contain at least 20 wt. % (of the total of all monomer units in the copolymer or composition) of a heteroacene monomer unit having the Formula (A2) and at least 20 wt. %, preferably between 20-80 wt. % of a monomer unit having the Formula (B/B').

Preferably $R^1$, $R^4$, $R^8$ and $R^{11}$ are the same and are methyl or methoxy groups, $R^{25}$, $R^{26}$ and $R^{27}$ are the same and are ethyl or isopropyl groups. In a preferred embodiment, when $R^1$, $R^4$, $R^8$ and $R^{11}$ are methyl groups, $R^{25}$, $R^{26}$ and $R^{27}$ are ethyl groups. In yet another a preferred embodiment, when $R^1$, $R^4$, $R^8$ and $R^{11}$ are methyl groups, $R^{25}$, $R^{26}$ and $R^{27}$ are isopropyl groups. In a further preferred embodiment, when $R^1$, $R^4$, $R^8$ and $R^{11}$ are methoxy groups, $R^{25}$, $R^{26}$ and $R^{27}$ are ethyl groups. In yet another preferred embodiment, when $R^1$, $R^4$, $R^8$ and $R^{11}$ are methoxy groups, $R^{25}$, $R^{26}$ and $R^{27}$ are isopropyl groups.

In yet another preferred embodiment, the heteroacene monomer units of the present invention are those of Formulae (A3) and (A4):

Preferred PAHCs and compositions of the present invention contain at least 20 wt. % (of the total of all monomer units (A), (A1), (A2), (A3), (A4) and (B)/(B') in the copolymer or composition) of a heteroacene monomer unit having the Formula (A3), (A4) and at least 20 wt. %, preferably between 20-80 wt. % of a monomer unit having the Formula (B)/(B').

The "R" substituents (that is $R^1$, $R^2$, etc) denote the substituents at the positions of the heteroacene according to conventional nomenclature:

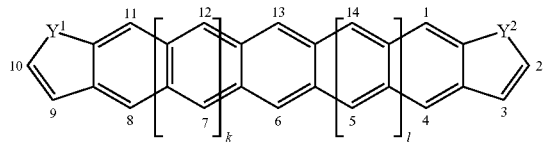

Heteroacene monomers according to the present invention may be synthesised by any known method within the common general knowledge of a person skilled in the art. In a preferred embodiment, methods disclosed in WO2008/107089 and *Organic Letters,* 2004, Volume 6, number 19, pages 3325-3328 can be employed for the synthesis of heteroacene compounds used in the present invention. High permittivity analogues of the PAHCs of the invention may be prepared according to WO2012/160383 and WO2012/164282.

Monomer Units (B)/(B')

The following are some preferred characteristics of the cis/trans-indenofluorene monomer unit defined above as (B)/(B').

In monomer unit (B)/(B'), preferably each $R^{1'}$, $R^{2'}$, $R^{3'}$, $R^{4'}$, $R^{5'}$, $R^{6'}$ and $R^{7'}$, each of which may be the same or different, is selected from hydrogen; a branched or unbranched, substituted or unsubstituted $C_1$-$C_{10}$ alkyl group; a branched or unbranched, substituted or unsubstituted $C_2$-$C_{10}$ alkenyl group; a branched or unbranched, substituted or unsubstituted $C_2$-$C_{10}$ alkynyl group; an optionally substituted $C_3$-$C_{10}$ cycloalkyl group; an optionally substituted $C_6$-$C_{10}$ aryl group; an optionally substituted $C_1$-$C_{10}$ heterocyclic group; an optionally substituted $C_1$-$C_{10}$ heteroaryl group; an optionally substituted $C_1$-$C_{10}$ alkoxy group; an optionally substituted $C_6$-$C_{10}$ aryloxy group; an optionally substituted $C_7$-$C_{10}$ alkylaryloxy group; an optionally substituted $C_2$-$C_{10}$ alkoxycarbonyl group; an optionally substituted $C_7$-$C_{20}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group; a $C_2$-$C_{10}$ alkynyl group substituted with a SiH$_2$R$^{22}$ group, a $C_2$-$C_{10}$ alkynyl substituted with a SiHR$^{22}$R$^{23}$ group, or a $C_2$-$C_{10}$ alkynyl substituted with a —Si(R$^{22}$)$_x$(R$^{23}$)$_y$(R$^{24}$)$_z$ group, wherein each of x, y and z, and R$^{15}$, R$^{16}$, R$^{18}$, R$^{19}$ and R$^{20}$, R$^{22}$, R$^{23}$ and R$^{24}$ are as defined above.

In monomer unit (B)/(B'), preferably each $R^{1'}$, $R^{2'}$, $R^{3'}$, $R^{4'}$, each of which may be the same or different, is H, methyl, methoxy, cyano, cyanomethyl, preferably H.

Preferably, in monomer unit (B)/(B'), at least one of $R^{1'}$, $R^{2'}$, $R^{3'}$, $R^{4'}$, $R^{5'}$, $R^{6'}$ and $R^{7'}$ is a polar or more polarising group and n=1 to 100, preferably 1 to 50, preferably 1 to 20, even more preferably 1 to 10 and more preferably 1 to 5, wherein n refers to the number of monomer units. Preferably, at least one of $R^{1'}$, $R^{2'}$, $R^{3'}$, $R^{4'}$, $R^{5'}$, $R^{6'}$ and $R^{7'}$, more preferably at least two of $R^{1'}$, $R^{2'}$, $R^{3'}$, $R^{4'}$, $R^{5'}$, $R^{6'}$, $R^{7'}$ are polar or polarising groups.

In a preferred embodiment, the one or more polar or polarising group(s) is independently selected from the group consisting of nitro group, nitrile group, $C_{1-40}$ alkyl group substituted with a nitro group, a nitrile group, a cyanate group, an isocyanate group, a thiocyanate group or a thioisocyanate group; a $C_{1-40}$ alkoxy group optionally substituted with a nitro group, a nitrile group, a cyanate group, an isocyanate group, a thiocyanate group or a thioisocyanate group; a $C_{1-40}$ carboxylic acid group optionally substituted with a nitro group, a nitrile group, a cyanate group, an isocyanate group, a thiocyanate group or a thioisocyanate group; a $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

In a more preferred embodiment, the one or more polar or polarising group(s) is independently selected from the group consisting of nitro group, nitrile group, $C_{1-10}$ alkyl group substituted with a nitrile group, a cyanate group, or an isocyanate group; $C_{1-20}$ alkoxy group, $C_{1-20}$ carboxylic acid group, $C_{2-20}$ carboxylic acid ester; sulfonic acid ester; cyanate group, isocyanate group, thiocyanate group, thioisocyanate group, and an amino group; and combinations thereof.

More preferably the polar or polarizing group is selected from the group consisting of $C_{1-4}$ cyanoalkyl group, $C_{1-10}$ alkoxy group, nitrile group and combinations thereof.

More preferably the polar or polarizing group(s) is selected from the group consisting of cyanomethyl, cyanoethyl, cyanopropyl, cyanobutyl, methoxy, ethoxy, propoxy, butoxy, nitrile, NH$_2$ and combinations thereof. Preferably at least one of the $R^{1'}$, $R^{2'}$, $R^{3'}$, $R^{4'}$, $R^{5'}$, $R^{6'}$, $R^{7'}$ groups is a polar or more polarising group, which may be the same or different.

Yet more preferably, the polar or polarizing group(s) is selected from the group consisting of isopropyl cyano, cyclohexylcyano, methoxy, ethoxy, nitrile and combinations thereof. Preferably at least one of $R^{1'}$, $R^{2'}$, $R^{3'}$, $R^{4'}$, $R^{5'}$, $R^{6'}$, $R^{7'}$ is a polar or more polarising group, which may be the same or different.

More preferably, the polar group or polarizing group(s) is selected from the group consisting of methoxy, ethoxy, propoxy, butoxy and combinations thereof, wherein at least one of $R^{1'}$, $R^{2'}$, $R^{3'}$, $R^{4'}$, $R^{5'}$, $R^{6'}$, $R^{7'}$ is a polar or more polarising group, which may be the same or different.

More preferably, the polar or polarizing group(s) is selected from the group consisting of methoxy and ethoxy, wherein at least one of $R^{1'}$, $R^{2'}$, $R^{3'}$, $R^{4'}$, $R^{5'}$, $R^{6'}$, $R^{7'}$ is the same polar or more polarising group. Yet more preferably, at least one of $R^{5'}$, $R^{6'}$, $R^{7'}$ is the same polar or more polarising group.

Preferably, $R^{1'}$, $R^{2'}$, $R^{3'}$, $R^{4'}$, $R^{5'}$, $R^{6'}$, $R^{7'}$, are independently selected from the groups consisting of $C_{1-2}$ alkoxy, $C_{1-3}$ cyanoalkyl, CN and mixtures thereof, and n=1 to 10.

Preferably, $R^{1'}$, $R^{2'}$, $R^{3'}$, $R^{4'}$, $R^{5'}$, $R^{6'}$, $R^{7'}$, are independently selected from the group consisting of $C_{1-4}$ alkoxy, $C_{3-20}$ cycloalkylcyano, $C_{1-4}$ cyanoalkyl, CN and mixtures thereof, and n=1 to 10.

Preferably, $R^{5'}$ $R^{6'}$ and R7', is independently selected from the group consisting of 1 $C_{1-4}$ alkoxy, and n=1 to 10.

Preferably, $R^{5'}$, $R^{6'}$ and $R^{7'}$, are independently selected from the group consisting of methoxy, ethoxy, cyanomethyl, cyanoethyl, CN and mixtures thereof, and n=1 to 10.

In an even more preferred embodiment of the present invention, the monomer unit (B)/(B') comprises at least one substituent that is methoxy, or cyano, Preferably, $R^{4'}$ is independently selected from the group consisting of 1 $C_{1-4}$ alkoxy, and n=1 to 10.

Preferably, $R^{1'}$, $R^{2'}$, $R^{3'}$, $R^{4'}$, $R^{5'}$, $R^{6'}$, $R^{7'}$ are independently selected from methoxy, ethoxy, isopropylcyano, cyanomethyl, cyanoethyl, CN and mixtures thereof, and n=1 to 10.

Preferably, $R^{1'}$, $R^{2'}$, $R^{3'}$, $R^{4'}$, $R^{5'}$, $R^{6'}$, $R^{7'}$ are independently selected from methoxy, ethoxy, cyanomethyl, CN and mixtures thereof, and n=1 to 10.

Preferably, $R^{1'}$, $R^{2'}$, $R^{3'}$, $R^{4'}$, $R^{5'}$, $R^{6'}$, $R^{7'}$ are independently selected from methoxy, ethoxy and mixtures thereof, and n=1 to 10.

The copolymers of the present invention may be a random or block copolymer of different monomer units. In such a case, any monomer unit defined by Formula (A) or (B)/(B'), may be combined with a different or same monomer unit of (A) or (B)/(B') provided that at least one monomer unit (A) is bonded to at least one monomer unit (B)/(B').

The ratio of the monomers in the polycyclic aromatic hydrocarbon copolymers can be altered to allow for adjustment of the permittivity relative to a homopolymer. Furthermore, optionally the monomer unit of (A) or (B)/(B') may be mixed with monomer units which do not meet the definition of (A) or (B)/(B'), provided that the average permittivity of the binder in the compositions is preferably between 3.4 and 8.0. In this regard, other suitable monomer units include arylamine monomers such as (C), fluorene monomers such as (D) and sprirobifluorene monomers such as (E):

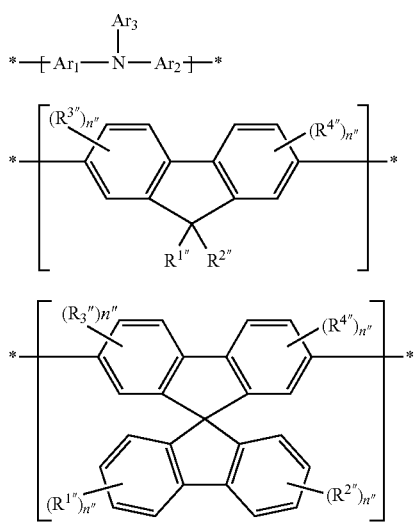

wherein each $R^{1'''}$, $R^{2'''}$, $R^{3'''}$ and $R^{4'''}$, each of which may be the same or different, is selected from the same group as $R^1$, $R^2$, $R^3$ and $R^4$, already defined above;

$Ar_1$, $Ar_2$ and $Ar_3$, which may be the same or different, each represent, independently an optionally substituted $C_{6-40}$ aromatic group (mononuclear or polynuclear). Preferably at least one of $Ar_1$, $Ar_2$ and $Ar_3$ is substituted with at least one polar or more polarising group, and n=1 to 20, preferably 1 to 10 and more preferably 1 to 5. Preferably, at least one of $Ar_1$, $Ar_2$ and $Ar_3$ is substituted with 1, 2, 3, or 4, more preferably 1, 2 or 3, more preferably 1 or 2, preferably 1 polar or more polarising group(s); and n''=1 to 3.

Organic Semiconductor Compositions

An organic semiconductor composition according to the first aspect of the present invention comprises a copolymer composition, the composition having a permittivity at 1000 Hz of greater than 1.5, more preferably greater than 3.4, and yet more preferably between 1.5 and 6.5, even more preferably between 3 and 6.5, more preferably between 3.0 to 5.0 and still more preferably between 3.4 to 4.5.

The organic semiconductor composition according to the present invention can comprise a polycyclic aromatic hydrocarbon copolymer as herein disclosed. In a preferred embodiment, an organic semiconductor composition may comprise a copolymer as defined herein, further comprising a polycrystalline polyacene small molecule semiconductor as described in our application WO 2012/164282, wherein the PAHC has a permittivity at 1000 Hz of between 3.4 and 8, preferably between 3.4 and 6.5, more preferably between 4 and 6.5, yet more preferably between 3.4 to 4.5. In a preferred embodiment, a copolymer as defined herein may be used in combination with a polyacene small molecule, where the 'dried state' composition contains between 10 to 50% of the polyacene small molecule and 10 to 90% of the PAHC.

The organic semiconductor composition according to the present invention can comprise a polycyclic aromatic hydrocarbon copolymer as herein disclosed. In a preferred embodiment, an organic semiconductor composition may comprise a copolymer as defined herein, further comprising an organic binder, wherein the organic binder has a permittivity at 1000 Hz of between 3.4 and 8, preferably between 3.4 and 6.5, more preferably between 4 and 6.5, yet more preferably between 3.4 to 4.5.

In a particularly preferred embodiment, a copolymer as defined herein may be used in combination with an organic binder, wherein the organic binder has a permittivity at 1000 Hz of between 3.4 and 8.0, preferably between 3.6 and 6.5, more preferably between 3.4 to 4.5.

In yet another preferred embodiment, a copolymer of the invention preferably has a permittivity at 1000 Hz of between 3.4 and 8.0, preferably between 3.4 and 4.5.

The concentration of the copolymer and solvent present in the composition will vary depending on the preferred solution coating method, for example ink jet printing compositions require low viscosity, low solids loading compositions, whilst screen printing processes require high viscosity, high solids loading compositions. Following deposition of the copolymer composition, the solvent is preferably evaporated to afford the semiconductor layer having 1-99.9% by weight of the binder and 0.1 to 99% by weight of the copolymer (in the printed or dried state) based on a total weight of the composition; preferably the semiconductor layer having 25 to 75% by weight of the small molecule polyacene and 25 to 75% by weight of the copolymer.

In the composition prior to deposition, one or more of the above-described copolymers is preferably present at a concentration of at least 0.1 wt %, preferably 0.5 wt % based on a total weight of the composition. The upper limit of the concentration of the copolymer in the composition is often near the solubility limit of that copolymer in the particular solvent at the temperature of the composition during its application to a substrate such as in the fabrication of an electronic device. Typical compositions of the present invention comprise one of the copolymers at a concentration ranging from about 0.1 wt %, preferably 0.5 wt % to about 20.0 wt % based on a total weight of the composition, more typically, from about 0.5 wt % to about 10.0 wt %, more typically 0.5 to 5.0, more typically 1 to 3 wt %.

In the printed or dried composition, one or more of the above-described copolymers is preferably present at a concentration of at least 10 wt % based on a total weight of the composition, preferably between 10 and 90 wt %, more preferably between 20 and 80 wt %, more preferably between 30 and 70 wt %, more preferably between 40 and 60 wt %.

In a preferred embodiment, one or more solvents may be present in the organic semiconductor compositions.

Suitable solvents include, but are not limited to, tetrahydrofuran, aromatic hydrocarbons such as toluene, o-xylene, m-xylene, p-xylene, mesitylene, bromomesitylene, anisole, bromoanisole, bromobenzene, tetralin, o-xylene, 1,4-dioxane, methylethylketone, gamma-butyrolactone, cyclohexanone, morpholine, N-methylpyrollidone, ethyl acetate, n-butyl acetate, dimethylformamide, dimethylacetamide, decalin or mixtures of two or more thereof. Preferably, no chlorinated solvents are used.

Solvent blends may also be utilised. Suitable solvent blends include, but are not limited to compositions of the above solvents in conjunction with solvents such as dimethylformamide, dimethylacetamide, dimethylsulfoxide, methyl ethyl ketone, dichloromethane, dichlorobenzene, furfuryl alcohol, dimethoxyethane and ethyl acetate, higher boiling point alkanes such as n-heptane and alcohols such as isopropyl alchohol. Such compositions (prior to deposition) preferably contain a suitable solvent in an amount of greater than 50 wt % based on a total weight of the composition, preferably between 60 and 95 wt % based on a total weight of the composition.

In yet another preferred embodiment, one or more additional composition components may be present in the organic semiconductor composition. Suitable additional composition components include, but are not limited to, a polymer additive, a rheological modifier, a surfactant, another semiconductor that is a matched hole transfer compound for the copolymer. In some exemplary embodiments, the compositions comprise a polymer additive selected from the group consisting of polystyrene, poly(alpha-methylstyrene), poly(pentafluorostyrene), poly(methyl methacrylate), poly(4-cyanomethyl styrene), poly(4-vinylphenol), or any other suitable polymer disclosed in U.S. Patent Application Publication No. 2004/0222412 A1 or U.S. Patent Application Publication No. 2007/0146426 A1. In some desired embodiments, the polymer additive comprises polystyrene, poly(alpha-methylstyrene), poly(pentafluorostyrene) or poly(methyl methacrylate). In some exemplary embodiments, the compositions comprise a surfactant selected from fluorinated surfactants or fluorosurfactants. When present, each additional composition component is independently present in an amount of greater than 0 to about 50 wt % based on a total weight of the composition. Preferably, each additional composition component is independently present in an amount ranging from about 0.0001 to about 10.0 wt % based on a total weight of the composition. For example, when a polymer is present in the composition, the polymer additive is typically present in an amount of greater than 0 to about 5.0 wt %, preferably from about 0.5 to about 3.0 wt % based on a total weight of the composition. For example, when a surfactant is present in the composition, the surfactant is preferably present in an amount of greater than 0 to about 1.0 wt %, more typically, from about 0.001 to about 0.5 wt % based on a total weight of the composition.

The organic semiconductor composition according to the present invention preferably has a charge mobility value of at least 0.5 $cm^2V^{-1}s^{-1}$, preferably between 0.5 and 8.0 $cm^2V^{-1}s^{-1}$, more preferably between 0.5 and 6.0 $cm^2V^{-1}s^{-1}$, more preferably between 0.8 and 5.0 $cm^2V^{-1}s^{-1}$, more preferably between 1.0 and 5.0 $cm^2V^{-1}s^{-1}$, more preferably between 1.5 and 5.0 $cm^2V^{-1}s^{-1}$, more preferably between 2.0 and 5.0 $cm^2V^{-1}s^{-1}$. The charge mobility value of the semiconductor composition can be measured using any standard method known to those skilled in the art, such as techniques disclosed in *J. Appl. Phys.*, 1994, Volume 75, page 7954 and WO 2005/055248, preferably by those described in WO 2005/055248.

The organic semiconductor composition according to the present invention may be prepared by any known method within the common general knowledge of a person skilled in the art. In a preferred embodiment, the organic semiconductor composition is prepared by the method disclosed in WO 2005/055248 or by using the method disclosed herein, preferably by using the method disclosed herein.

Preferably, organic semiconductor compositions according to the present invention are semiconducting compositions having a permittivity at 1000 Hz greater than 1.5, more preferably greater than 3.4, and yet more preferably, between 3.4 and 8. In a preferred embodiment, the compositions have a permittivity at 1000 Hz of between 4.0 and 7, more preferably between 4.0 and 6.5, even more preferably between 4.0 and 6 and yet more preferably between 3.4 and 4.5.

Organic Semiconductor Layers

The organic semiconductor compositions according to the present invention may be deposited onto a variety of substrates, to form organic semiconductor layers.

The organic semiconductor layer according to the present invention may be prepared using a method comprising the steps of:

(i) Mixing the organic semiconductor composition according to the present invention with a solvent to form a semiconductor layer formulation;

(ii) Depositing said formulation onto a substrate; and (iii) Optionally removing the solvent to form an organic semiconductor layer.

Useful substrate materials include, but are not limited to, polymeric films such as polyamides, polycarbonates, polyimides, polyketones, polyethylene terephthalate (PET) and polyethylene naphthalate (PEN), and inorganic substrates such as silica, alumina, silicon wafers and glass. The surface of a given substrate may be treated, e.g. by reaction of chemical functionality inherent to the surface with chemical reagents such as silanes or exposure of the surface to plasma, in order to alter the surface characteristics.

Prior to depositing the organic semiconductor composition onto the substrate, the composition may be combined with one or more solvents in order to facilitate the deposition step. Suitable solvents include any solvent which is able to dissolve both the copolymer, and which upon evaporation from the solution blend, give a coherent, defect-free layer. Suitable solvents for the copolymer can be determined by preparing a contour diagram for the material as described in ASTM Method D 3132 at the concentration at which the mixture will be employed. The material is added to a wide variety of solvents as described in the ASTM method.

Suitable solvents include, but are not limited to, tetrahydrofuran, aromatic hydrocarbons such as toluene, o-xylene, m-xylene, p-xylene, mesitylene, bromomesitylene, anisole, bromoanisole, bromobenzene, tetralin, o-xylene, 1,4-dioxane, methylethylketone, gamma-butyrolactone, cyclohexanone, morpholine, N-methylpyrollidone, ethyl acetate, n-butyl acetate, dimethylformamide, dimethylacetamide, decalin or mixtures of two or more thereof. Preferably, no chlorinated solvents are used.

In accordance with the present invention it has further been found that the level of the solids content in the organic semiconducting layer formulation is also a factor in achieving improved mobility values for electronic devices such as OFETs. The solids content of the formulation is commonly expressed as follows:

$$\text{Solids content (\%)} = \frac{a+b}{a+b+c} \times 100$$

wherein: a=mass of polyacene small molecule, b=mass of PAHC and c=mass of solvent.

The solids content of the formulation is preferably 0.1 to 10% by weight, more preferably 0.5 to 5% by weight.

Suitable conventional deposition methods include, but are not limited to, spin coating, spray coating, blade/slot-die coating, flexographic printing, gravure printing, roll-to-roll web-coating, and dip coating, as well as printing processes such as ink-jet printing, screen printing, and offset lithography. In one desired embodiment, the resulting composition is a printable composition, even more desirably, an ink jet printable composition.

Once the composition is deposited onto a substrate surface, the solvent may be removed to form an organic semiconductor layer. Any suitable method may be used to remove the solvent. For example, the solvent may be removed by evaporation or drying. Typically, at least about 80 percent of the solvent is removed to form the semiconductor layer. For example, at least about 85 weight percent, at least about 90 weight percent, at least about 92 weight percent, at least about 95 weight percent, at least about 97 weight percent, at least about 98 weight percent, at least about 99 weight percent, or at least about 99.5 weight percent of the solvent is removed.

The solvent often can be evaporated at any suitable temperature. In some methods, the solvent mixture is evaporated at ambient temperature. In other methods, the solvent is evaporated at a temperature higher or lower than ambient temperature. For example, a platen supporting the substrate can be heated or cooled to a temperature higher or lower than ambient temperature. In still other preferred methods, some or most of the solvent can be evaporated at ambient temperature, and any remaining solvent can be evaporated at a temperature higher than ambient temperature. In methods where the solvent evaporates at a temperature higher than ambient temperature, the evaporation can be carried out under an inert atmosphere, such as a nitrogen atmosphere.

Alternatively, the solvent can be removed by application of reduced pressure (i.e., at a pressure that is less than atmospheric pressure) such as through the use of a vacuum. During application of reduced pressure, the solvent can be removed at any suitable temperature such as those described above.

The rate of removal of the solvent can affect the resulting semiconductor layer. For example, if the removal process is too rapid, poor packing of the semiconductor molecules can occur during crystallisation. Poor packing of the semiconductor molecules can be detrimental to the charge mobility of the semiconductor layer. The solvent can evaporate entirely on its own in an uncontrolled fashion (i.e., no time constraints), or the conditions can be controlled in order to control the rate of evaporation. In order to minimise poor packing, the solvent can be evaporated while slowing the evaporation rate by covering the deposited layer. Such conditions can lead to a semiconductor layer having a relatively high degree of crystallinity.

After removal of a desired amount of solvent to form the semiconductor layer, the semiconductor layer can be annealed by exposure to heat or solvent vapours, i.e., by thermal annealing or solvent annealing.

The organic semiconductor layer according to the present invention preferably has a charge mobility value of at least 0.5 $cm^2V^{-1}s^{-1}$, preferably between 0.5 and 8.0 $cm^2V^{-1}s^{-1}$, more preferably between 0.5 and 6.0 $cm^2V^{-1}s^{-1}$, more preferably between 0.8 and 5.0 $cm^2V^{-1}s^{-1}$, more preferably between 1 and 5.0 $cm^2V^{-1}s^{-1}$, more preferably between 1.5 and 5.0 $cm^2V^{-1}s^{-1}$, more preferably between 2.0 and 5.0 $cm^2V^{-1}s^{-1}$. The charge mobility value of the semiconductor layer can be measured using any standard method known to those skilled in the art, such as techniques disclosed in *J. Appl. Phys.*, 1994, Volume 75, page 7954 and WO 2005/055248, preferably by those described in WO 2005/055248.

Preferably, the organic semiconductor layer(s) of the present invention are semiconducting layers having a permittivity at 1000 Hz of between 3.4 and 8. In a preferred embodiment, the layer(s) have a permittivity at 1000 Hz of between 4.0 and 7, more preferably between 4.0 and 6.5, yet more preferably between 4.0 and 6 and even more preferably between 3.4 and 4.5

Electronic Devices

The invention additionally provides an electronic device comprising the organic semiconductor composition according to the present invention. The composition may be used, for example, in the form of a semiconducting layer or film. Additionally, the invention preferably provides an electronic device comprising the organic semiconductor layer according to the present invention.

The thickness of the layer or film may be between 0.02 and 20 microns, 0.2 and 20 microns, preferably between 0.05 and 10 microns, preferably between 0.5 and 10 microns, between 0.05 and 5 microns, even more preferably between 0.5 and 5 microns, yet more preferably between 0.5 and 2 microns, and more preferably between 0.02 and 1 microns.

The electronic device may include, without limitation, organic field effect transistors (OFETS), organic light emitting diodes (OLEDS), photodetectors, organic photovoltaic (OPV) cells, sensors, lasers, memory elements and logic circuits.

Exemplary electronic devices of the present invention may be fabricated by solution deposition of the above-described organic semiconductor composition onto a substrate.

DETAILED DESCRIPTION OF THE INVENTION

General

For the heteroacene monomers used in the invention whilst one isomer is shown the invention applies to pure cis isomer, pure trans isomer and mixtures of cis and trans isomers.

The term "about" in relation to a numerical value x means, for example, x±10%.

The word "substantially" does not exclude "completely" e.g. a composition which is "substantially free" from Y may be completely free from Y. Where necessary, the word "substantially" may be omitted from the definition of the invention.

"Molecular weight" of a polymeric material (including monomeric or macromeric materials), as used herein, refers to the number-average molecular weight unless otherwise specifically noted or unless testing conditions indicate otherwise.

A "polymer" means a material formed by polymerising and/or crosslinking one or more monomers, macromers and/or oligomers and having two or more repeat units.

As used herein, the term "alkyl" group refers to a straight or branched saturated monovalent hydrocarbon radical, having the number of carbon atoms as indicated. By way of non limiting example, suitable alkyl groups include, methyl, ethyl, propyl, n-butyl, t-butyl, iso-butyl and dodecanyl.

As used herein, the term "alkoxy" group include without limitation, methoxy, ethoxy, 2-methoxyethoxy, t-butoxy, etc.

As used herein, the term "amino" group includes, without limitation, dimethylamino, methylamino, methylphenylamino, phenylamino, etc.

The term "carbyl" refers to any monovalent or multivalent organic radical moiety which comprises at least one carbon atom other without any non-carbon atoms (—C≡C), or optionally combined with at least one non-carbon atoms such as N, O, S, P, SI, Se, As, Te or Ge (for example carbonyl etc.).

The term "hydrocarbon" group denotes a carbyl group that additionally contains one or more H atoms and optionally contains one or more hetero atoms.

A carbyl or hydrocarbyl group comprising 3 or more carbon atoms may be linear, branched and/or cyclic, including spiro and/or fused rings.

Preferred carbyl or hydrocarbyl groups include alkyl, alkoxy, alkylcarbonyl, alkylcarbonyloxy, alkoxycarbonyloxy, each of which is optionally substituted and has 1 to 40, preferably 1 to 18 carbon atoms, furthermore optionally substituted aryl, aryl derivative or aryloxy having 6 to 40, preferably 6 to 18 carbon atoms, furthermore alkylaryloxy, arylcarbonyl, aryloxycarbonyl, arylcarbonyloxy and aryloxycarbonyloxy, each or which is optionally substituted and has 7 to 40, more preferable 7 to 25 carbon atoms.

The carbyl or hydrocarbyl group may be saturated or unsaturated acyclic group, or a saturated or unsaturated cyclic group. Unsaturated acyclic or cyclic groups are preferred, especially alkenyl and alkynyl groups (especially ethynyl).

In the polyacenes of the present invention, the optional substituents on the said $C_1$-$C_{40}$ carbyl or hydrocarbyl groups for $R_1$-$R_{14}$ etc. preferably are selected from: silyl, sulpho, sulphonyl, formyl, amino, imino, nitrilo, mercapto, cyano, nitro, halo, $C_{1-4}$ alkyl, $C_{6-12}$ aryl, $C_{1-4}$ alkoxy, hydroxy and/or all chemically possible combinations thereof. More preferable among these optional substituents are silyl and $C_{6-12}$ aryl and most preferable is silyl.

"Substituted alkyl group" refers to an alkyl group having one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

"Alkenyl group" refers to a monovalent group that is a radical of an alkene, which is a hydrocarbon with at least one carbon-carbon double bond. The alkenyl can be linear, branched, cyclic, or combinations thereof and typically contains 2 to 30 carbon atoms. In some embodiments, the alkenyl contains 2 to 20, 2 to 14, 2 to 10, 4 to 10, 4 to 8, 2 to 8, 2 to 6, or 2 to 4 carbon atoms. Exemplary alkenyl groups include, but are not limited to, ethenyl, propenyl, and butenyl.

"Substituted alkenyl group" refers to an alkenyl group having (i) one or more C—C double bonds, and (ii) one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

"Alkynyl group" refers to a monovalent group that is a radical of an alkyne, a hydrocarbon with at least one carbon-carbon triple bond. The alkynyl can be linear, branched, cyclic, or combinations thereof and typically contains 2 to 30 carbon atoms. In some embodiments, the alkynyl contains 2 to 20, 2 to 14, 2 to 10, 4 to 10, 4 to 8, 2 to 8, 2 to 6, or 2 to 4 carbon atoms. Exemplary alkynyl groups include, but are not limited to, ethynyl, propynyl, and butynyl.

"Substituted alkynyl group" refers to an alkynyl group having (i) one or more C—C triple bonds, and (ii) one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group or a silyl group).

"Cycloalkyl group" refers to a monovalent group that is a radical of a ring structure consisting of 3 or more carbon atoms in the ring structure (i.e., only carbon atoms in the ring structure and one of the carbon atoms of the ring structure is the radical).

"Substituted cycloalkyl group" refers to a cycloalkyl group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Cycloalkylalkylene group" refers to a monovalent group that is a ring structure consisting of 3 or more carbon atoms in the ring structure (i.e., only carbon atoms in the ring), wherein the ring structure is attached to an acyclic alkyl group (typically, from 1 to 3 carbon atoms, more typically, 1 carbon atom) and one of the carbon atoms of the acyclic alkyl group is the radical. "Substituted cycloalkylalkylene group" refers to a cycloalkylalkylene group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Aryl group" refers to a monovalent group that is a radical of an aromatic carbocyclic compound. The aryl can have one aromatic ring or can include up to 5 carbocyclic ring structures that are connected to or fused to the aromatic ring. The other ring structures can be aromatic, non-aromatic, or combinations thereof. Examples of preferred aryl groups include, but are not limited to, phenyl, 2-tolyl, 3-tolyl, 4-tolyl, biphenyl, 4-phenoxyphenyl, 4-fluorophenyl, 3-carbomethoxyphenyl, 4-carbomethoxyphenyl, terphenyl, anthryl, naphthyl, acenaphthyl, anthraquinonyl, phenanthryl, anthracenyl, pyrenyl, perylenyl, and fluorenyl.

"Substituted aryl group" refers to an aryl group having one or more substituents on the ring structure, wherein each of the one or more substituents comprises a monovalent moiety containing one or more atoms (e.g., a halogen such as F, an alkyl group, a cyano group, a hydroxyl group, or a carboxylic acid group).

"Arylalkylene group" refers to a monovalent group that is an aromatic ring structure consisting of 6 to 10 carbon atoms in the ring structure (i.e., only carbon atoms in the ring structure), wherein the aromatic ring structure is attached to an acyclic alkyl group having one or more carbon atoms (typically, from 1 to 3 carbon atoms, more typically, 1 carbon atom) and one of the carbons of the acyclic alkyl group is the radical.

"Substituted arylalkylene group" refers to an arylalkylene group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Acetyl group" refers to a monovalent radical having the formula —C(O)CH$_3$.

"Heterocyclic ring" refers to a saturated, partially saturated, or unsaturated ring structure comprising at least one of O, N, S and Se in the ring structure.

"Substituted heterocyclic ring" refers to a heterocyclic ring having one or more substituents bonded to one or more members of the ring structure, wherein each of the one or more substituents comprises a monovalent moiety containing one or more atoms (e.g., a halogen such as F, an alkyl group, a cyano group, a hydroxyl group, or a carboxylic acid group).

"Carbocyclic ring" refers to a saturated, partially saturated, or unsaturated ring structure comprising only carbon in the ring structure.

"Substituted carbocyclic ring" refers to a carbocyclic ring having one or more substituents bonded to one or more members of the ring structure, wherein each of the one or more substituents comprises a monovalent moiety containing one or more atoms (e.g., a halogen such as F, an alkyl group, a cyano group, a hydroxyl group, or a carboxylic acid group).

"Ether group" refers to a —$R_a$—O—$R_b$ radical wherein $R_a$ is a branched or unbranched alkylene, arylene, alkylarylene or arylalkylene hydrocarbon and $R_b$ is a branched or unbranched alkyl, aryl, alkylaryl or arylalkyl hydrocarbon.

"Substituted ether group" refers to an ether group having one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

Unless otherwise defined, a "substituent" or "optional substituent" is preferably selected from the group consisting of halo (I, Br, Cl, F), CN, $NO_2$, $NH_2$, —COOH and OH.

BRIEF DESCRIPTION OF THE DRAWINGS

Labels—A: Substrate; B: Gate electrode; C: Dielectric layer; D: Semiconductor layer; E: Source electrode; F: Gate electrode

EXAMPLES OF THE PRESENT INVENTION

Figure 1:
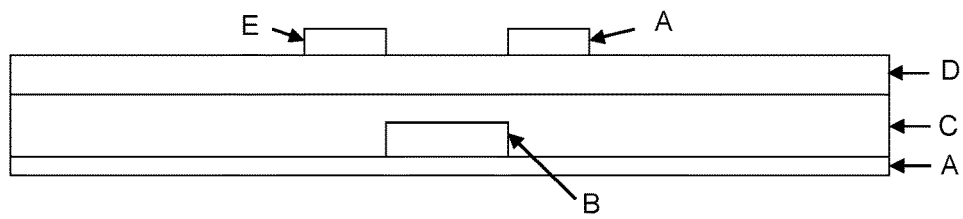
FIG. 1 is a representation of top contact/bottom gate organic thin film transistor (OTFT)
Figure 2:
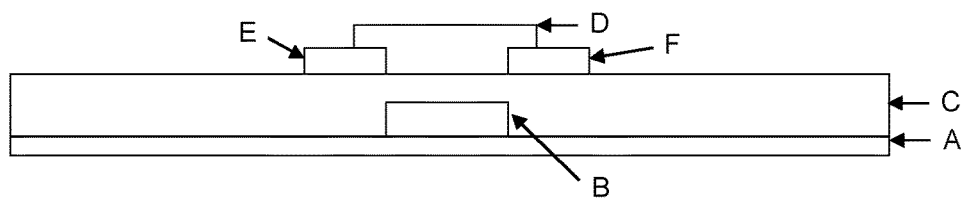
FIG. 2 is a representation of bottom contact/bottom gate (OTFT)
Figure 3:
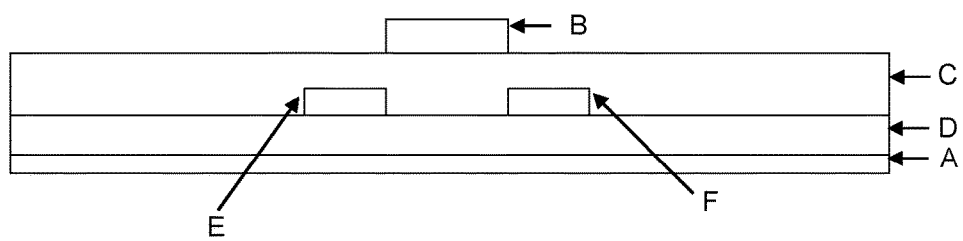
FIG. 3 is a representation of top contact/top gate (OTFT)
Figure 4:
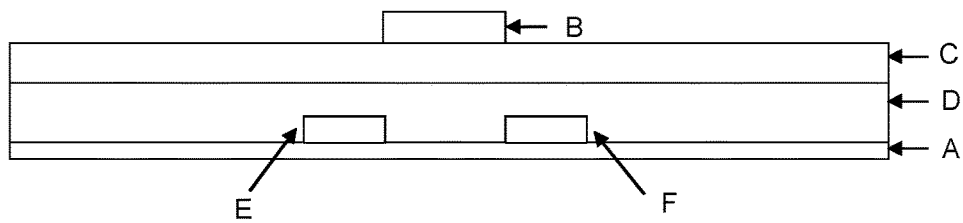
FIG. 4 is a representation of bottom contact/top gate (OTFT)
Figure 5:
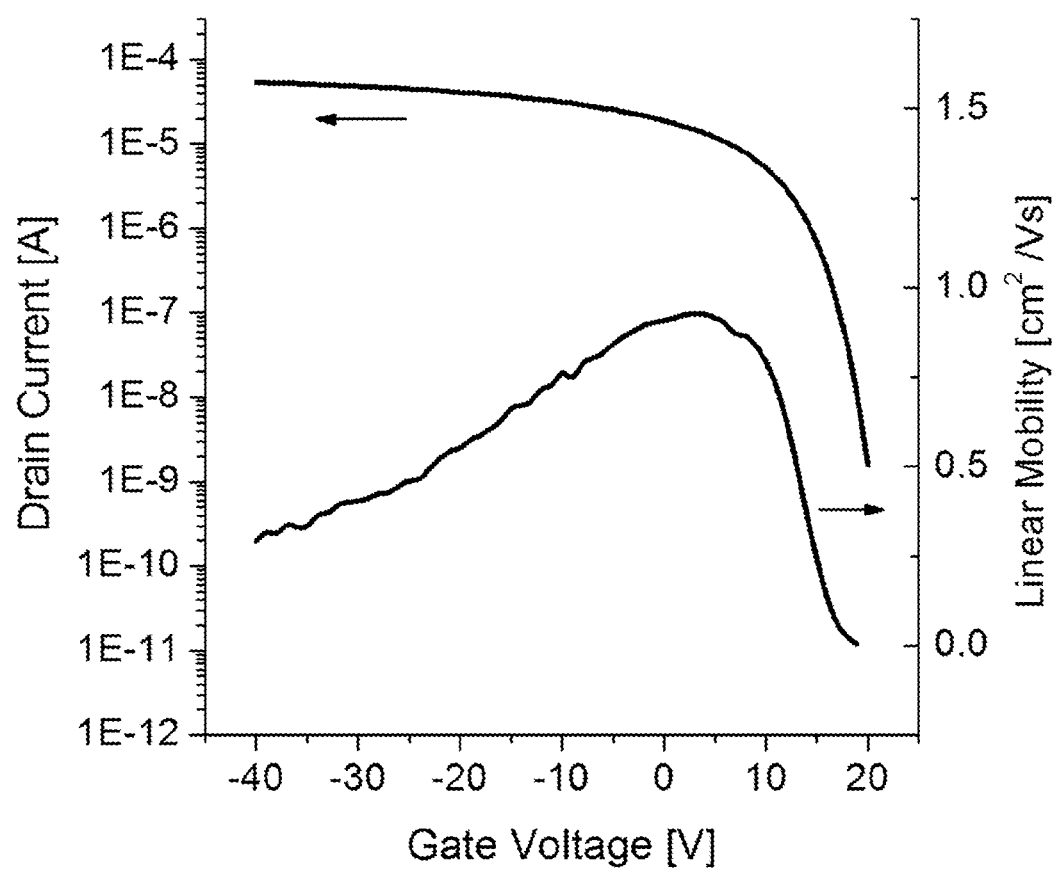
FIG. 5: Transfer characteristic for TG 10 micron channel length and 3000 micron channel width OTFT using 1,4,8,11-tetramethyl bis-triethysilylethynyl pentacene and PAHC (1) described as Formulation (1). Drain voltage is −2V.
Figure 6:
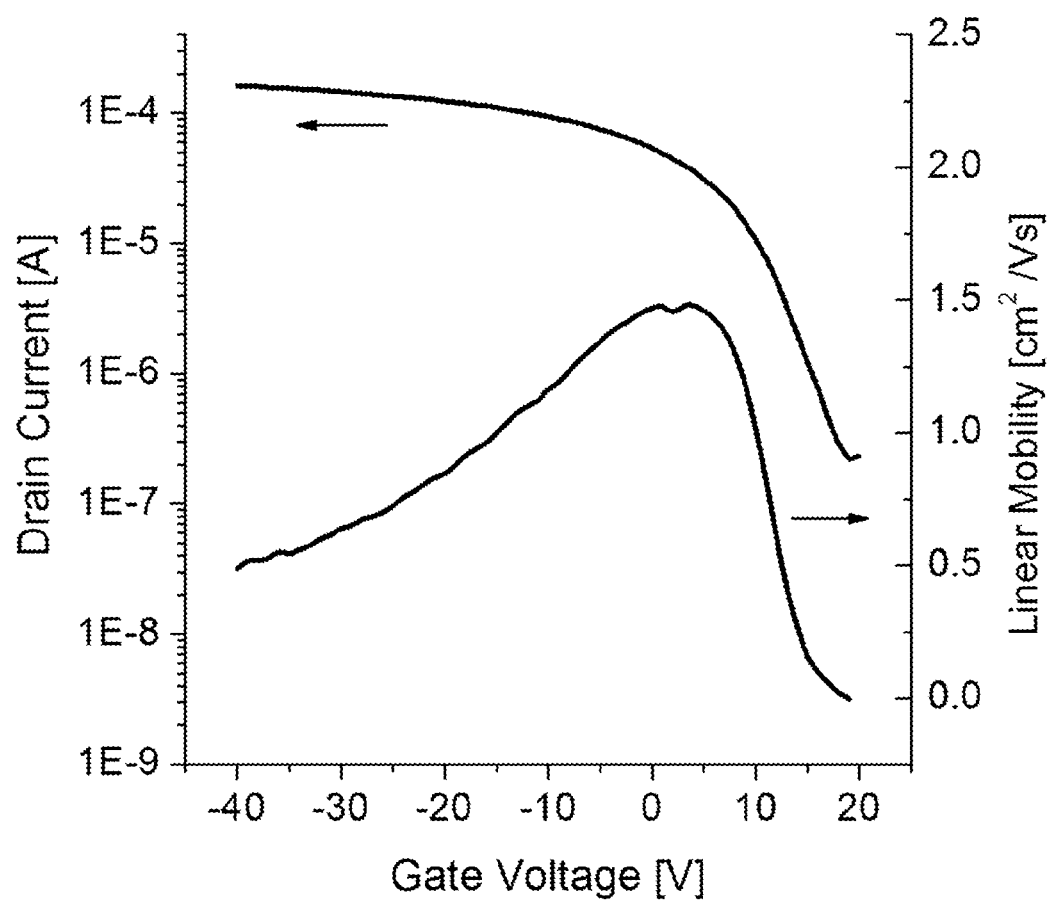
FIG. 6: Transfer characteristic for TG 30 micron channel length and 15000 micron channel width OTFT using 1,4,8,11-tetramethyl bis-triethysilylethynyl pentacene and PAHC (1) described as Formulation (1). Drain voltage is −2V.

The following examples of the present invention are merely exemplary and should not be viewed as limiting the scope of the invention.

Measurement of the Capacitance of the Polymer Binder

The polymer binder was diluted with tetralin in order to lower its viscosity and make it possible to obtain a film thickness of ~1 micron when spin coated for the spin speed range 1000-2000 rpm. The polymer binder solution was spin coated at 500 rpm for 10 seconds, followed by 1500 rpm for 30 seconds, onto ITO coated and cleaned 1×1 inch glass substrates.

To clean the ITO coated substrates they were submerged in a 3% solution of DECon 90 and put in an ultrasonic bath (water temperature >65° C.), washed with deionised water, submerged in deionised water and put in an ultrasonic bath (water temperature >65° C.), washed a further time with deionised water, submerged in isopropyl alcohol and then put in an ultrasonic bath (water temperature >65° C.), and then spin dried.

After deposition of the polymer binder the substrate was annealed on a hotplate at 120° C. for 5 minutes.

The substrate was then covered with a capacitance shadow mask, and top electrodes were deposited by evaporation of gold using a thermal deposition method. In order to determine the exact thickness of the polymer binder layer, the thickness was measured using a Dektak 3030 profilometer (available from Veeco, Plainview N.Y.) at three different positions and averaged; these values were subsequently used to calculate the dielectric constants of the polymer binders.

Capacitance measurements were then carried out using impedance analyser Agilent 43961A and a probe station. In order to improve the electrical contact between the ITO back electrode and the external probe electrode, a conductive silver paste was applied. The sample being measured was placed in a metal box on the metal plate to ensure minimum influence from the external environment.

Before each set of measurements was obtained, the analyser was calibrated using the 43961A Impedance Test Kit as a compensation routine was carried out to account for internal capacitance of the analyser and test fixture. The measurement calibration was carried out with open and shorted circuit; the dielectric constant was calculated using the following equation:

$$C = \varepsilon \times \varepsilon_o \times (A/d).$$

Wherein C is the capacitance (Farads), A is the area ($m^2$), d is the coating thickness (m), ε is the dielectric constant (permittivity), and $\varepsilon_o$ is the permittivity of free space and is taken as $8.8854 \times 10^{-12}$ F/m.

As a reference sample, a polystyrene sample (Mw~350,000) having a thickness of 1 μm was tested. The measured and calculated dielectric constant of the polystyrene reference was ε=2.55 at 10,000 Hz, which is in good agreement with the reported value (ε~2.5), refer to J. R. Wunsch, Polystyrene-Synthesis, Production and Applications, *Rapra Review Reports,* 2000, Volume 10, No. 4, page 32.

OTFT Fabrication Method

A substrate (either glass or a polymer substrate such as PEN) is patterned with Au source drain electrodes either by a process of thermal evaporation through a shadow mask or by photolithography (an adhesion layer of either Cr or Ti is deposited on the substrate prior to deposition of Au). The Au electrodes can the optionally be cleaned using an $O_2$ plasma cleaning process. A solution of organic semiconductor in binder is then applied by spin coating (the sample is flooded with the solution and the substrate is then spun at 500 rpm for 5 seconds then 1500 rpm for 1 minute). The coated substrate is then dried in air on a hot stage. The dielectric material, for example 3 wt % PTFE-AF 1600 (Sigma-Aldrich cat #469610) dissolved in FC-43) was then applied to the substrate by spin coating (sample flooded then spun at 500 rpm for 5 seconds then 1500 rpm for 30 seconds). The substrate was then dried in air on a hot stage (100° C. for 1 minute). A gate electrode (Au) is then defined over the channel area by evaporation through a shadow mask.

The mobility of the OTFT for the binders is characterised by placing on a manual probe station connected to a Keithley SCS 4200 semiconductor analyzer. The source drain voltage ($V_{DS}$) is set at −2V (linear) or −40V (saturation) and the gate voltage ($V_G$) scanned from +20V to −60V. Drain current is measured and mobility calculated from the transconductance.

The mobility of the OTFT for the formulations is characterised by placing on a semi-auto probe station connected to a Keithley SCS 4200 semiconductor analyzer. The source drain voltage is set at −2V and the gate voltage scanned from +20V to −40V. Drain current is measured and mobility calculated from the transconductance.

In linear regime, when $|V_G|>|V_{DS}|$, the source-drain current varies linearly with $V_G$. Thus the field effect mobility (μ) can be calculated from the gradient (S) of $I_{DS}$ vs. $V_G$ given by equation 1 (where $C_i$ is the capacitance per unit area, W is the channel width and L is the channel length):

$$S = \frac{\mu W C_i V_{DS}}{L} \quad \text{Equation 1}$$

In the saturation regime, the mobility is determined by finding the slope of $I_{DS}^{1/2}$ vs. $V_G$ and solving for the mobility (Equation 2)

$$I_{DS} \approx \frac{W C_i \mu (V_{GS} - V_T)^2}{2L} \quad \text{Equation 2}$$

The following examples are intended to explain the invention without restricting it. The methods, structures and properties described herein can also be applied to materials that are claimed in this invention but not explicitly described in the examples.

Compound (1): Preparation of 2,3-bis(1,3-dioxolan-2-yl)thiophene

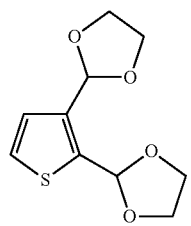 [SMILES: c1cc(C2OCCO2)c(C2OCCO2)s1]

A mixture of 2,3-thiophenedicarboxaldehyde (Aldrich 429872, 15.00 g, 107 mmol, 1 eq), ethylene glycol (33.17 g 535 mmol, 5 eq), p-toluenesulfonic acid (0.28 g, 1.5 mmol, 0.01 eq) in toluene (225 mL) were stirred at reflux using a Dean-Stark apparatus for 18 hours. The reaction mixture was then cooled to room temperature. Sodium carbonate solution (5% w/w, 250 mL) was added, the organic phase was separated and the aqueous extracted with EtOAc (2×125 mL). The combined organic extracts were dried over $MgSO_4$, filtered and concentrated in vacuo to give a brown oil (17.71 g). The product was purified by dry column chromatography (gradient elution: heptane; 10%-30% EtOAc:heptane) to give the product (1) a pale yellow oil (17.58 g, 72%). $^1$H NMR (CDCl$_3$, 600 MHz) 7.24 (1H, d, J=5.2 Hz), 7.10 (1H, d, J=5.2 Hz), 6.36 (1H, s), 6.05 (1H, s), 4.15-4.08 (4H, m) 4.02-3.98 (4H, m).

Compound (2): Preparation of 5-bromo-2,3-thiophenedicaboxaldehyde

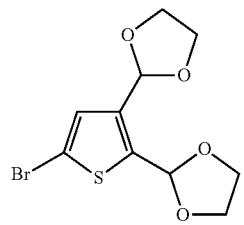 [SMILES: Brc1cc(C2OCCO2)c(C2OCCO2)s1]

A solution 2,3-bis(1,3-dioxolan-2-yl)thiophene(1), (17.10 g, 75 mmol, 1 eq) in THF (100 mL) was stirred at −78 deg C. under $N_2$. n-Butyllithium (Acros 10181852, 2.5M solution in hexanes, 38.76 mL, 96.9 mmol, 1.3 eq) was added dropwise and the solution stirred for 1 hour. N-Bromosuccinimide (Aldrich B81255, 16.11 g, 90.5 mmol, 1.2 eq) was then added portionwise over 15 minutes. The reaction mixture was then allowed to warm to room temperature with stirring overnight. Water (200 mL) was then added slowly. The mixture was then extracted with diethyl ether (2×250 mL), the extracts were washed with water (3×500 mL). The organic extract was dried over $MgSO_4$, filtered and concentrated in vacuo to give a pale yellow oil (14.59 g). The product was the added to 3M HCl (131 mL) and heated to reflux for 1 hour. The mixture was allowed to cool to room temperature and was then extracted with diethyl ether (3×750 mL). The combined organic extracts were dried over $MgSO_4$, filtered and concentrated in vacuo to give a brown semisolid (7.38 g). The product was then purified by dry column chromatography (gradient elution: heptane; 10%-50% EtOAc: heptane) to give the product (2) as a yellow solid (1.93 g, 12%). $^1$H NMR (CDCl$_3$, 300 MHz) 10.38 (1H, s), 10.26 (1H, s), 7.60 (1H, s).

Compound (3): Preparation of 2,8-dibromoanthra[2,3-b:6,7-b']dithiophene-5,11-dione/2,8-dibromoanthra[2,3-b:7,6-b']dithiophene-5,11-dione

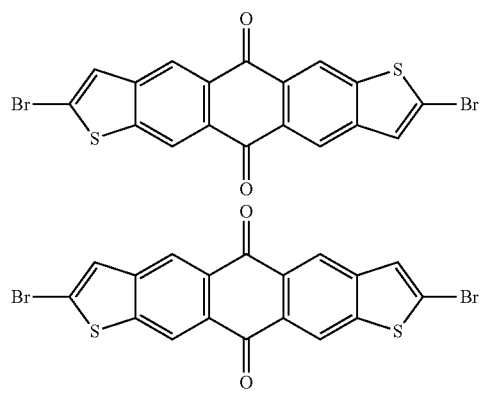

5-bromo-2,3-thiophenedicaboxaldehyde (2), (1.83 g, 8.3 mmol, 2 eq) and 1,4-cyclohexanedione (Aldrich 125423, 0.46 g, 4.1 mmol, 1 eq) were charged to a 250 mL round bottom flask. Methylated spirits (74 O.P., Fisher 11482874, 100 mL) was added and the mixture stirred at room temperature. 15% potassium hydroxide solution (3.81 mL, 10 mmol) was then added. A dark brown precipitate formed rapidly. The reaction mixture was then stirred for 3.5 hours. The solid was collected by filtration under suction. The filter cake was washed with methylated spirits (74 O.P., 100 mL). The solid was then dried in a vacuum oven to give the product (3) as an orange/brown solid (1.63 g, 83%). MS (ASAP) m/z 478 (M+, 100%).

Compound (4): Preparation of 2,8-dibromo-5,11-bis(triethylsilylethynyl)anthra[2,3-b:6,7-b']dithiophene/ 2,8-dibromo-5,11-bis(triethylsilylethynyl)anthra[2,3-b:7,6-b']dithiophene

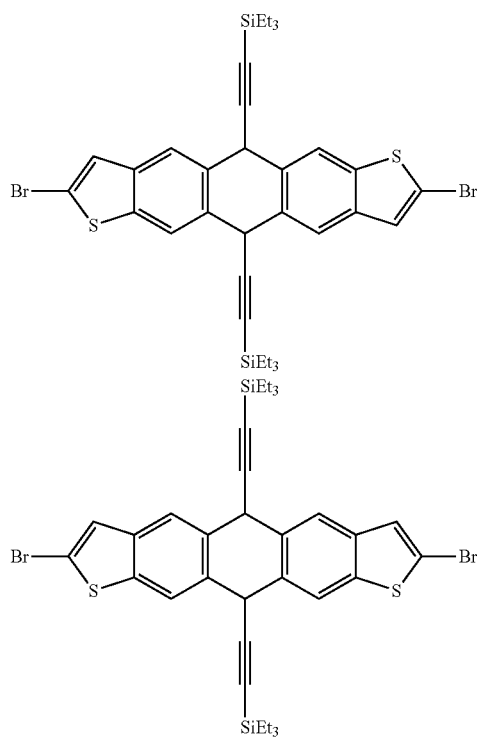

Triethylsilyl acetylene (Fluorochem S17615, 2.90 g, 20.7 mmol, 6.2 eq) was added dropwise to a solution of ethylmagnesium chloride (2M in THF, Aldrich 303828, 10.35 mL, 20.7 mmol, 6.2 eq) in THF (31 mL) at room temperature. The solution was then heated to 60 deg C. and stirred at this temperature for 45 minutes. The mixture was then cooled to 20 deg C. 2,8-dibromoanthra[2,3-b:6,7-b']dithiophene-5,11-dione/2,8-dibromoanthra[2,3-b:7,6-b']dithiophene-5,11-dione(3) (1.58 g, 3.3 mmol, 1 eq) was then added and the reaction mixture heated to 60 deg C. and stirred overnight. The reaction mixture was then cooled to 20 deg C. A solution of tin (II) chloride dihydrate (Sigma-Aldrich 208256, 7.46 g) in 10% HCl (34 mL) was added dropwise. The reaction mixture was then heated to 50 deg C. and stirred for 1 hr. The reaction mixture was then cooled to <10 deg C. and the solid collected by filtration. The filter cake was washed with methanol (50 mL) and water (50 mL) to give a dark red solid (1.94 g). The solid was then purified by flash column chromatography (gradient elution: heptane; 10%-50% DCM:heptane) to give a red crystalline solid (1.31 g). The product was purified by further flash column chromatography (gradient elution: heptane; 10%-50% DCM:heptane) to give the product (4) as a red crystalline solid (1.05 g). The product was then slurried in MeOH (50 mL) and the solid collected by filtration. The solid was then dried in a vacuum oven (0.89 g, 1.23 mmol, 37%) $^1$H NMR (300 MHz, CDCl$_3$) 8.96-8.93 (8H, m), 7.47-7.45 (4H, m), 1.27-1.20 (36H, m), 0.95-0.86 (24H, m). MS (ASAP) m/z 725 (M+, 100%).

Compound (5): Preparation of 2,8-bis[(4,4,5,5-tetramethyl-1,3,2-dioxaborolan-2-yl)]-6,12-dihydro-6,6,12,12-tetraoctyl-indeno[1,2-b]fluorene

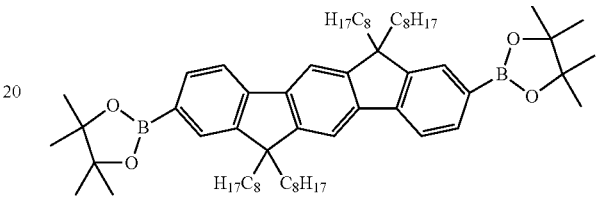

2,8-Dibromo-6,12-dihydro-6,6,12,12-tetraoctyl-indeno[1,2-b]fluorene (Sigma-Aldrich 708267, 2.17 g, 2.52 mmol, 1 eq) in THF (44 mL) was stirred at −40 deg C. under N$_2$. n-Butyllithium (Acros 10181852, 2.5M solution in hexanes, 12 mL, 30.0 mmol, 12 eq) was added dropwise. The reaction mixture was allowed to stir at −40 deg C. for 1 hour, then 2-isopropoxy-4,4,5,5-tetramethyl-1,3,2-dioxaborolane (Sigma-Aldrich 417149, 6 mL, 32.5 mmol, 13 eq) was added. The reaction mixture was then allowed to warm to room temperature with stirring overnight. Saturated ammonium chloride solution (50 mL) and DCM (50 mL) were added. The mixture was then extracted with EtOAc (4×60 mL). The combined organic extracts were washed with brine (100 mL) dried over Na$_2$SO$_4$, filtered and concentrated in vacuo to give a colourless oil (4.52 g). The product was purified by dry column chromatography (gradient elution: 2%-10% EtOAc:heptane) to give the product as a pale yellow oil which solidified on standing. Recrystallisation from THF/MeCN gave the product (5) as a colourless crystalline solid, (1.02 g, 1.07 mmol, 42%). $^1$H NMR (300 MHz, CDCl$_3$) 7.83-7.45 (8H, m), 2.07-1.97 (8H, m), 1.39 (24H, s), 1.19-1.01 (40H, m), 0.80 (12H, t, J=7.0 Hz), 0.55-0.53 (8H, m).

EXAMPLE (1)

PAHC (1): Preparation of TES-anthracenedithiophene-6,12-dihydro-6,6,12,12-tetraoctyl-indeno[1,2-b]fluorene copolymer A mixture of 2,8-dibromo-5,11-bis(triethylsilylethynyl)anthra[2,3-b:6,7-b']dithiophene/2,8-dibromo-5,11-bis(triethylsilylethynyl)anthra[2,3-b:7,6-b']dithiophene(4) (0.20 g, 0.28 mmol, 0.5 eq), 2,8-Dibromo-6,12-dihydro-6,6,12,12-tetraoctyl-indeno[1,2-b]fluorene (Sigma-Aldrich 708267, 0.24 g, 0.28 mmol, 0.5 eq), 2,8-bis[(4,4,55-tetramethyl-1,3,2-dioxaborolan-2-yl)]-6,12-dihydro-6,6,12,12-tetraoctyl-indeno[1,2-b]fluorene(5) (0.53 g, 0.55 mmol, 1 eq), tetrakis(triphenylphosphine)palladium (0) (Acros 12065360, 0.022 g, 0.02 mmol, 0.03 eq), 2M K$_2$CO$_3$ (1.7 mL, 3.4 mmol, 6 eq) and Aliquat® 336 (Sigma-Aldrich 205613, 8 drops) in toluene (40 mL) was degassed by passing a stream of nitrogen through the solution for 30 minutes. The mixture was then heated to reflux. After 2 hours HPLC confirmed the presence of oligomers. The reaction mixture was allowed to cool to 50 deg C. The reaction mixture was poured into MeOH (130 mL) with stirring. After 30 minutes the precipitated solid was collected by filtration under suction using a Buchner funnel to give a green solid (0.53 g). The solid was purified by dry column chromatography (eluent: THF). The fractions containing the product were concentrated in vacuo to give the abrown (0.29 g). The solid was purified again by flash column chromatography (eluent: THF). The fractions containing the product were concentrated in vacuo to give a green solid (0.27 g). The solid was dissolved in THF (15 mL) and poured into methanol (45 mL). The precipitated solid was collected by filtration under suction using a Buchner funnel. The solid obtained was then dried in a vacuum oven to give the product as a dark green powder (0.22 g) which was characterised as follows: GPC Mn=4328 Daltons, $N_{av}$=7.

Formulation 1

TES-anthracenedithiophene-6,12-dihydro-6,6,12,12-tetraoctyl-indeno[1,2-b]fluorene copolymer, PAHC (1) and polyacene 1, (1,4,8,11-tetramethyl-6,13-bis(triethylsilylethynyl)pentacene) (70:30 ratio by weight) were dissolved in 1,2,3,4-tetrahydronaphthalene at 1.7 wt. % total solids. This was coated as an organic semiconductor layer in an OTFT according to the method described above. The formulation was spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s then 1500 rpm for 20 s). Finally an Au gate electrode was deposited by shadow mask evaporation.

Mobility in the OTFT was 0.9 $cm^2V^{-1}s^{-1}$ at channel length L=10 μm, (linear mobility).

Mobility in the OTFT was 1.4.$cm^{2-1}s^{-1}$, at channel length L=30 μm, (linear mobility).

Particularly preferred PAHCs according to the present invention are shown in the following table:

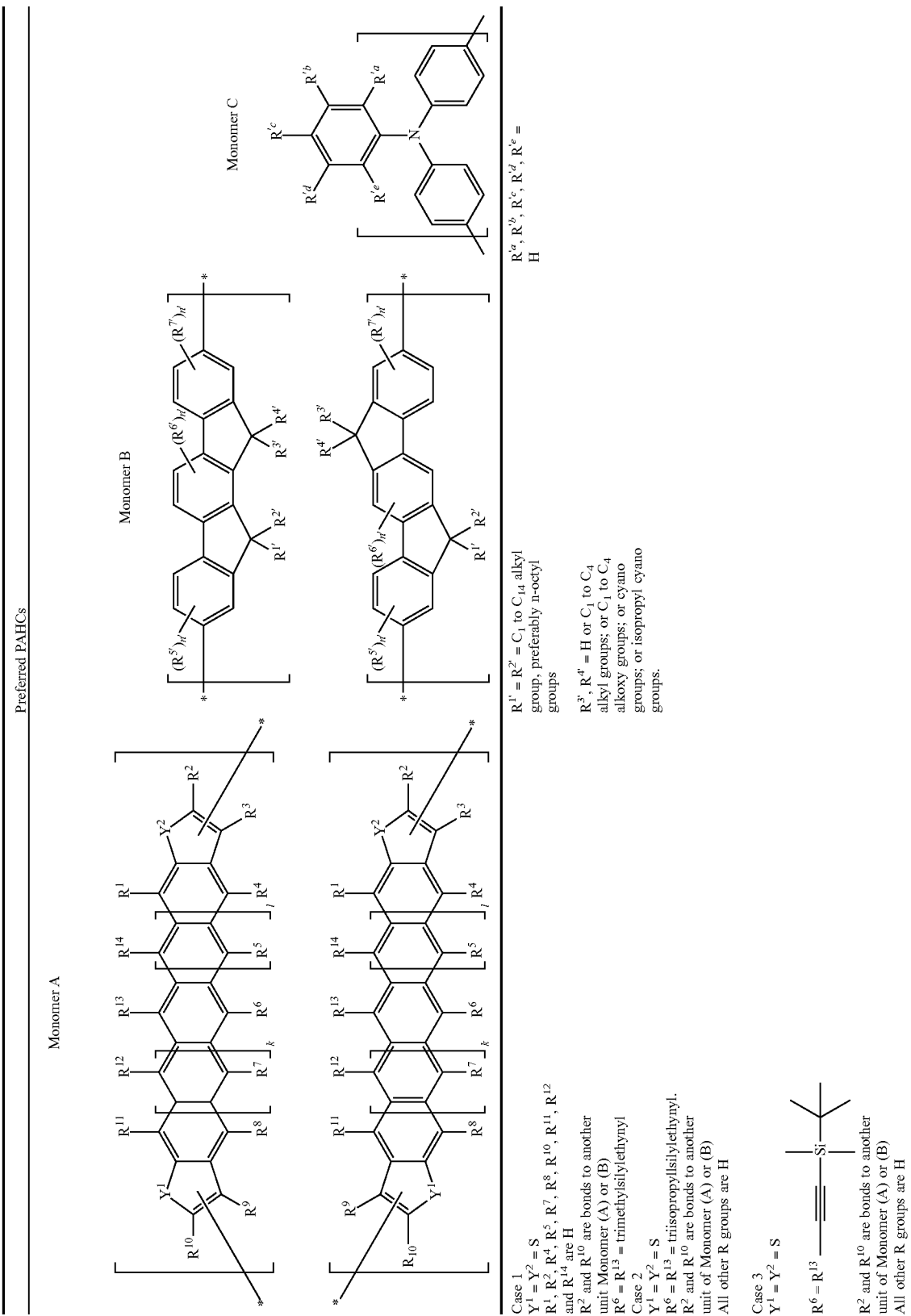

-continued

Preferred PAHCs

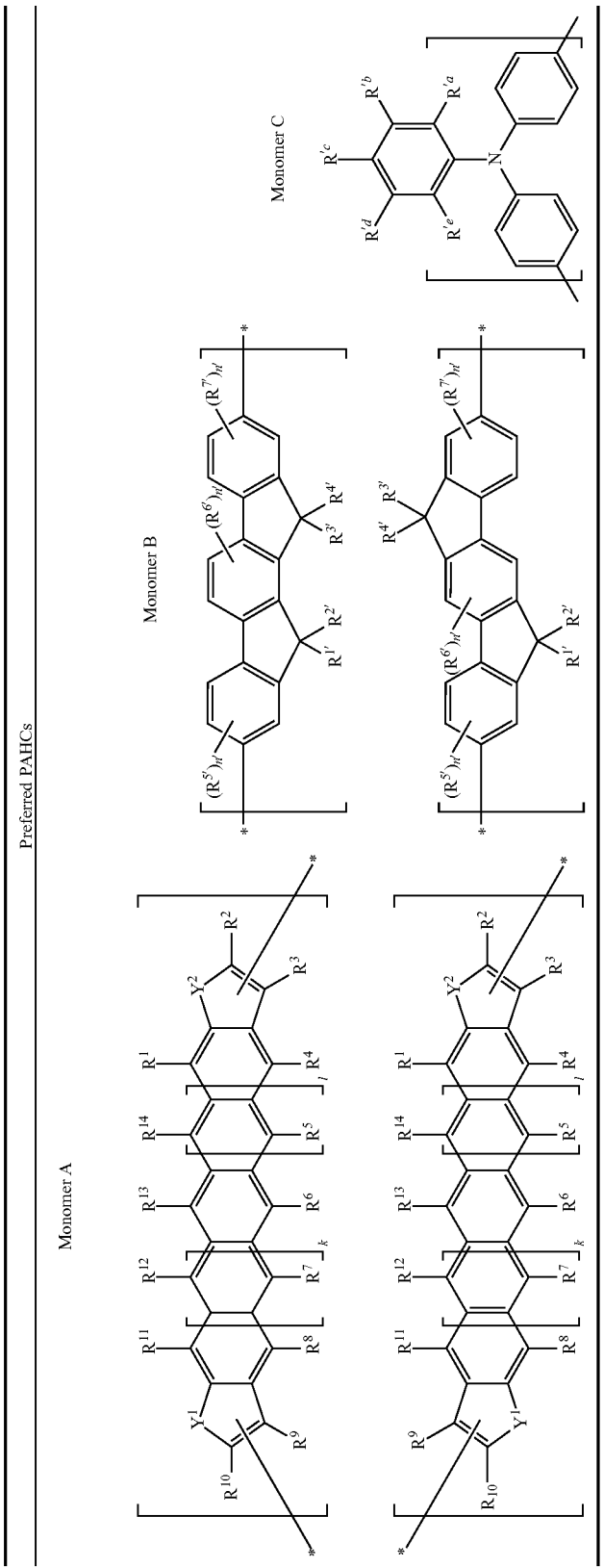

Monomer A

Monomer B

Monomer C

Case 4
$Y^1 = Y^2 = S$
$R^6 = R^{13}$ = triethylsilylethynyl
$R^2$ and $R^{10}$ are bonds to another unit of Monomer (A) or (B)
All other R groups are H
Case 5
$Y^1 = Y^2 = S$
$R^2$ and $R^{10}$ are bonds to another unit of Monomer (A) or (B)
All other R groups are H
Case 6

$R^6 = R^{13} =$ 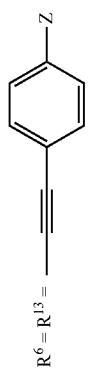

where $Z = C_1$-$C_5$ alkyl/branched alkyl (e.g. methyl or isopropyl)

Case 1
Case 2
Case 3

$R^{1'} = R^{2'} = C_1$ to $C_{14}$ alkyl group, preferably n-octyl groups $R'^b, R'^d, R'^e = H$
$R'^a$ and $R'^c = C_1$ to $C_4$ alkyl

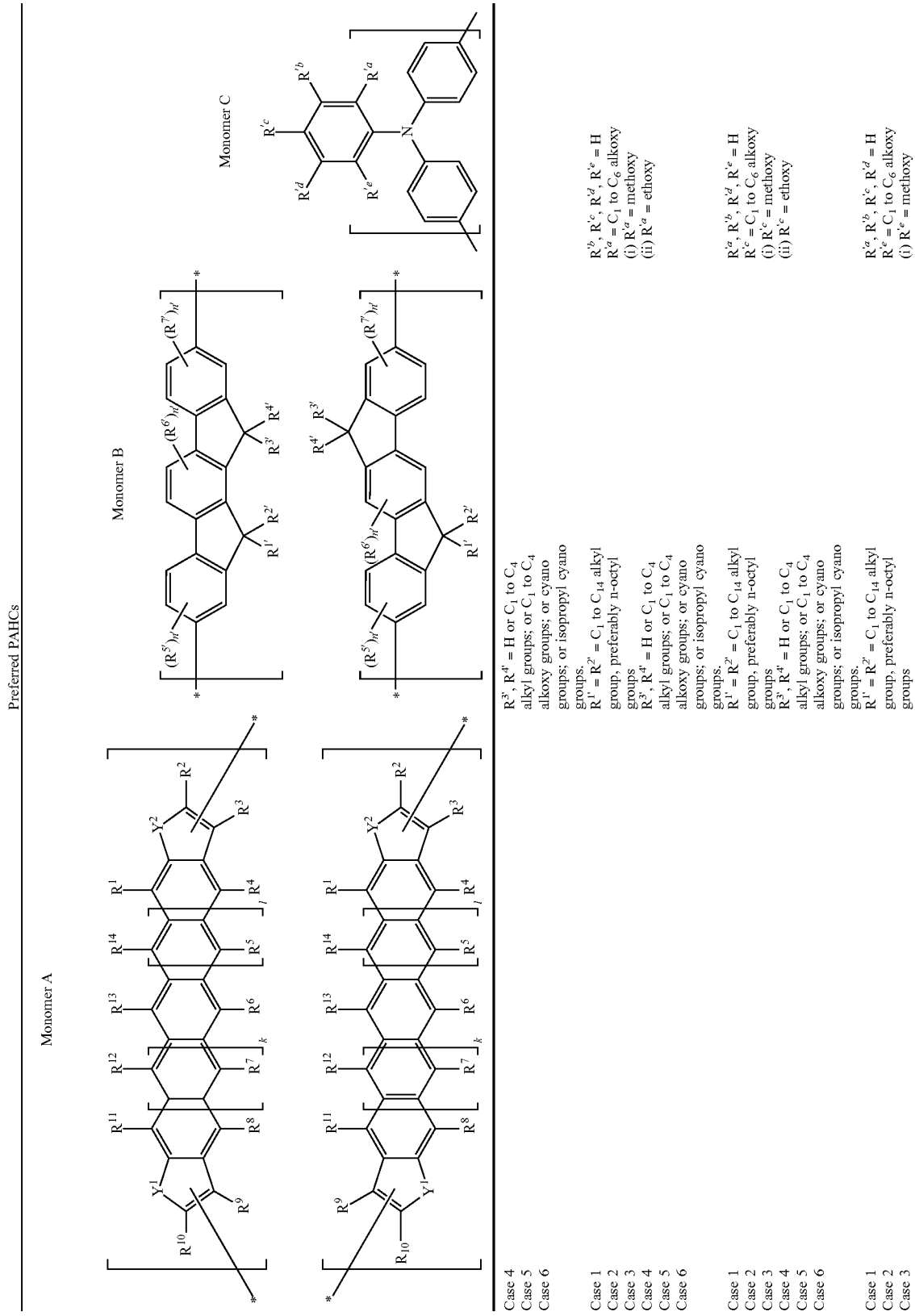

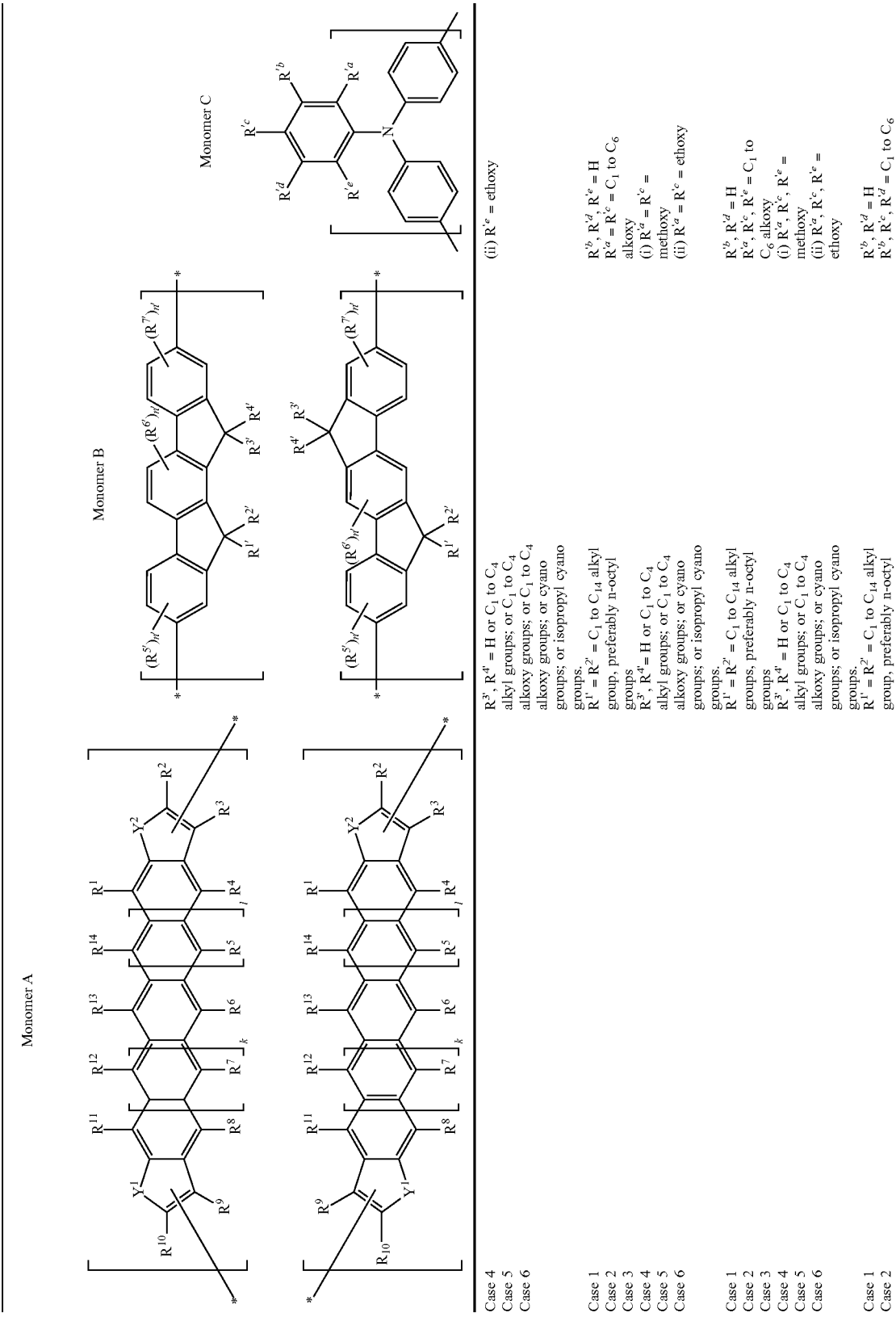

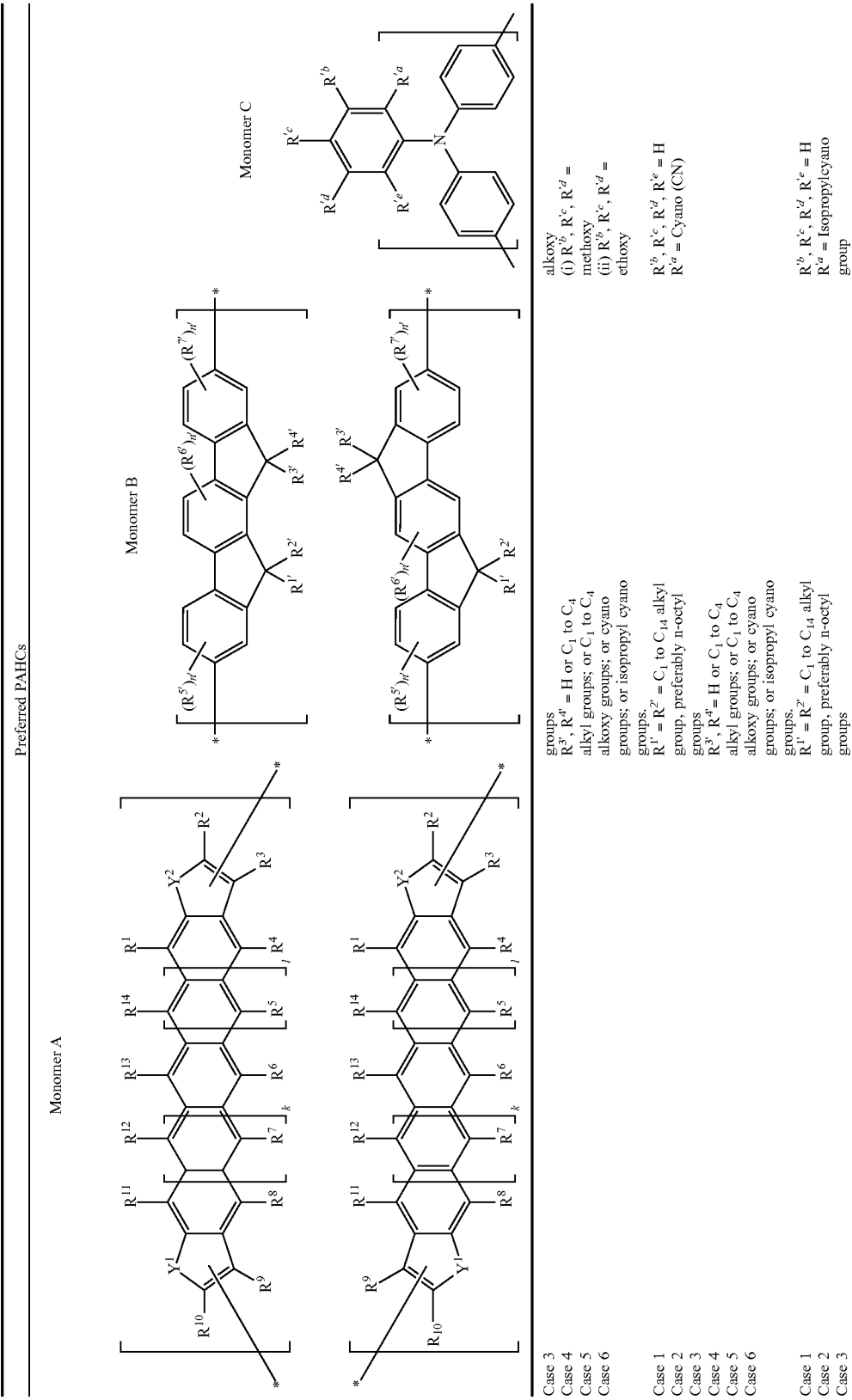

-continued
Preferred PAHCs
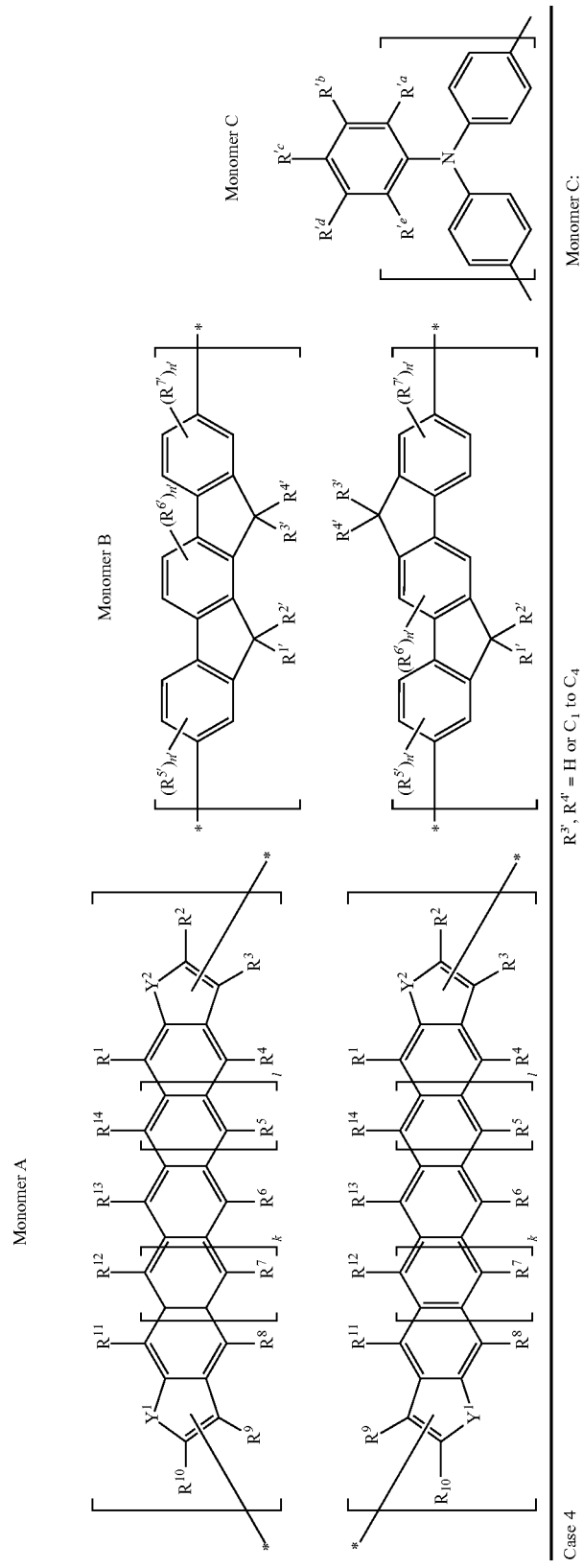
Monomer A / Monomer B / Monomer C
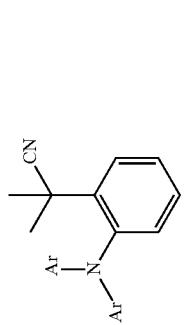
Monomer C:
R'a, R'b, R'd, R'e = H
R'c = Isopropylcyano group
R3', R4' = H or C1 to C4 alkyl groups; or C1 to C4 alkoxy groups; or cyano groups; or isopropyl cyano groups.
R1' = R2' = C1 to C14 alkyl group, preferably n-octyl groups
Case 4
Case 5
Case 6
Case 1
Case 2
Case 3

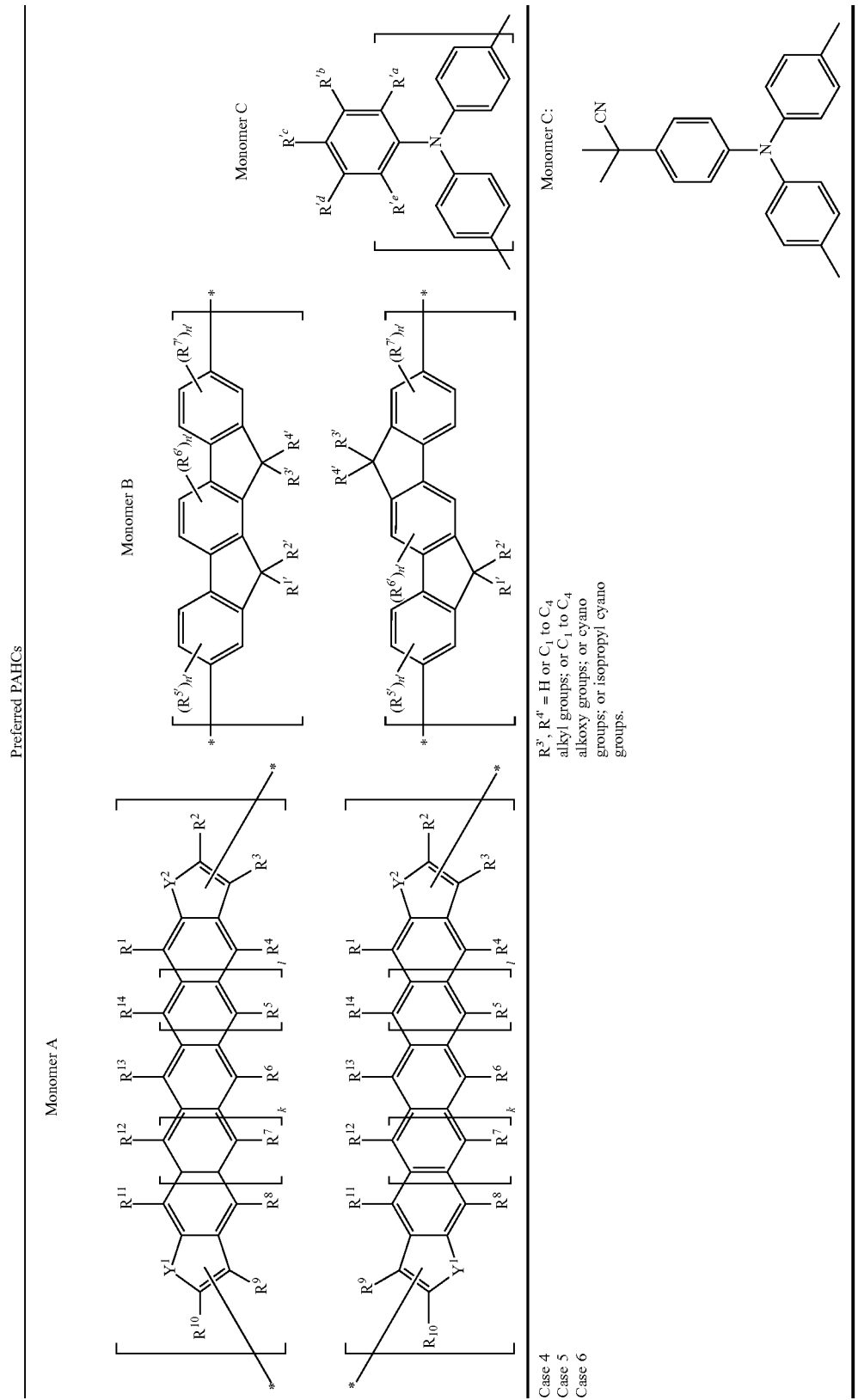

The organic semiconductors compounds specified in the table are particularly preferred as they combine the beneficial properties of high charge transport mobility (of the binders) with a polarity that is more compatible with benign, non-chlorinated solvents that will be desirable for use in large area printing. In addition, as these compounds are more polar once deposited as the OSC layer, or alternatively as a component in the OSC layer, they are expected to be resistant to being re-dissolved by the hydrophobic solvents used for the organic gate insulators (OGI) such as Cytop. Furthermore, it is expected that the polar binders are useful for both top gate and bottom gate OTFTs, particularly for bottom gate OTFTs.

The invention claimed is:

1. A Polycyclic Aromatic Hydrocarbon Copolymer (PAHC) comprising a random copolymer of at least one heteroacene monomer unit having the Formula (A) and at least one monomer unit having the Formula (B)/(B'):

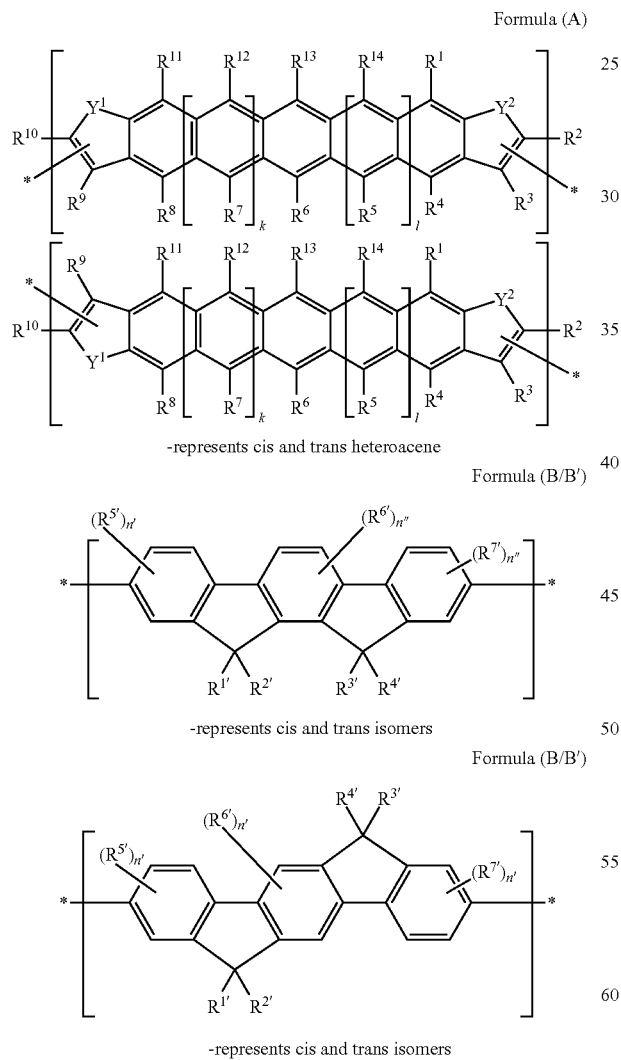

-represents cis and trans heteroacene

Formula (B/B')

-represents cis and trans isomers

Formula (B/B')

-represents cis and trans isomers wherein monomers of Formula (A) can be the pure cis isomer, or the pure trans isomer, or a mixture of the cis and trans isomers;

$Y^1$ and $Y^2$ are independently O, S, Se or NR''''

R'''' is H or cyclic, straight-chain or branched $C_1$ to $C_{10}$ alkyl group, k is 0 or 1 l is 0 or 1 wherein each of $R^1$, $R^2$, $R^3$, $R^4$, $R^5$, $R^7$, $R^8$, $R^9$, $R^{10}$, $R^{11}$, $R^{12}$, and $R^{14}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group; a $C_2$-$C_{10}$ alkynyl group substituted with a —SiH$_2$R$^{22}$ group, a $C_2$-$C_{10}$ alkynyl substituted with a —SiHR$^{22}$R$^{23}$ group, or a $C_2$-$C_{10}$ alkynyl moiety substituted with a —Si(R$^{22}$)$_x$(R$^{23}$)$_y$(R$^{24}$)$_z$ group;

wherein each of $R^6$ and $R^{13}$, which may be the same or different, independently represents a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group; a $C_2$-$C_{10}$ alkynyl group substituted with a —SiH$_2$R$^{22}$ group, a $C_2$-$C_{10}$ alkynyl substituted with a —SiHR$^{22}$R$^{23}$ group, or a $C_2$-$C_{10}$ alkynyl moiety substituted with a —Si(R$^{22}$)$_x$(R$^{23}$)$_y$(R$^{24}$)$_z$ group;

wherein each $R^{22}$ group is independently selected from the group consisting of a branched or unbranched, substituted or unsubstituted $C_1$-$C_{10}$ alkyl group, a branched or unbranched, substituted or unsubstituted $C_2$-$C_{10}$ alkynyl group, a substituted or unsubstituted $C_2$-$C_{20}$ cycloalkyl group, a substituted or unsubstituted $C_2$-$C_{10}$ alkenyl group, and a substituted or unsubstituted $C_6$-$C_{20}$ cycloalkylalkylene group;

each $R^{23}$ group is independently selected from the group consisting of a branched or unbranched, substituted or unsubstituted $C_1$-$C_{10}$ alkyl group, a branched or unbranched, substituted or unsubstituted $C_2$-$C_{10}$ alkynyl group, a substituted or unsubstituted $C_2$-$C_{10}$ alkenyl group, a substituted or unsubstituted $C_2$-$C_{20}$ cycloalkyl group, and a substituted or unsubstituted $C_6$-$C_{20}$ cycloalkylalkylene group;

$R^{24}$ is independently selected from the group consisting of hydrogen, a branched or unbranched, substituted or unsubstituted $C_2$-$C_{10}$ alkynyl group, a substituted or unsubstituted $C_2$-$C_{20}$ cycloalkyl group, a substituted or unsubstituted $C_6$-$C_{20}$ cycloalkylalkylene group, a substituted $C_5$-$C_{20}$ aryl group, a substituted or unsubstituted $C_6$-$C_{20}$ arylalkylene group, an acetyl group, a substituted or unsubstituted $C_3$-$C_{20}$ heterocyclic ring comprising at least one of O, N, S and Se in the ring;

wherein x=1 or 2; y=1 or 2; z=0 or 1; and (x+y+z)=3;

wherein each of $R^{15}$ $R^{16}$, $R^{18}$, $R^{19}$ and $R^{20}$ independently represent H or optionally substituted $C_1$-$C_{40}$ carbyl or hydrocarbyl group optionally comprising one or more heteroatoms;

wherein $R^{17}$ represents a halogen atom, H or optionally substituted $C_1$-$C_{40}$ carbyl or $C_1$-$C_{40}$ hydrocarbyl group optionally comprising one or more heteroatoms;

wherein at least two of $R^1$, $R^2$, $R^3$, $R^4$, $R^8$, $R^9$, $R^{10}$ and $R^{11}$ are a bond, represented by —*, to another monomer unit having the Formula (A) or (B/B'); and wherein for the indenofluorene monomer, $R^{1'}$, $R^{2'}$, $R^{3'}$, $R^{4'}$, $R^{5'}$, $R^{6'}$, and $R^{7'}$ which may be the same or different, each independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group.

2. A PAHC according to claim 1, comprising 20 to 40% of monomer (A) and 60 to 80% of monomer (B/B'), based on the total of all monomer units (A) and (B/B') in the copolymer.

3. A PAHC according to claim 1, wherein R$^2$=R$^{10}$ which represent H, F, Cl, Br, I, CN, optionally fluorinated or perfluorinated straight-chain or branched alkyl having 1 to 20 carbon atoms, optionally fluorinated or perfluorinated straight-chain or branched alkoxy having 1 to 20 carbon atoms, or optionally fluorinated or perfluorinated aryl having 6 to 30 carbon atoms.

4. A PAHC according to claim 1, wherein k=l=0 or 1.

5. A PAHC according to claim 1, wherein the copolymers have a number average molecular weight (Mn) of between 500 and 100,000.

6. A PAHC according to claim 1, wherein the copolymers are semiconducting copolymers having a permittivity at 1000 Hz of greater than 1.5.

7. A PAHC according to claim 6, wherein the copolymers are semiconducting copolymers having a permittivity at 1000 Hz of between 3.4 and 8.0.

8. A PAHC according to claim 1, wherein at least one of R$^1$, R$^2$, R$^3$, R$^4$, R$^5$, R$^6$, R$^7$, R$^8$, R$^9$, R$^{10}$, R$^{11}$, R$^{12}$, R$^{13}$ and R$^{14}$ are (tri-$C_{1-20}$ hydrocarbylsilyl)$C_{1-4}$alkynyl-groups.

9. A PAHC according to claim 1, wherein R$^1$, R$^3$, R$^4$, R$^8$, R$^9$ and R$^{11}$ are hydrogen.

10. A PAHC according to claim 1, wherein —Si(R$^{22}$)$_x$(R$^{23}$)$_y$(R$^{24}$)$_z$ is selected from the group consisting of trimethylsilyl, triethylsilyl, tripropylsilyl, dimethylethylsilyl, diethylmethylsilyl, dimethylpropylsilyl, dimethylisopropylsilyl, dipropylmethylsilyl, diisopropylmethylsilyl, dipropylethylsilyl, dii sopropylethylsilyl, diethyli sopropylsilyl, tri-isopropylsilyl, trimethoxysilyl, triethoxysilyl, triphenylsilyl, diphenylisopropylsilyl, diisopropylphenylsilyl, diphenylethylsilyl, diethylphenylsilyl, diphenylmethylsilyl, triphenoxysilyl, dimethylmethoxysilyl, dimethylphenoxysilyl, and methylmethoxyphenyl.

11. A PAHC according to claim 1, having the Formula (A1) or (A2)

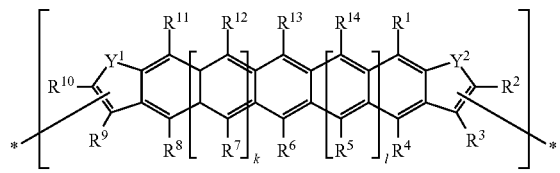

Formula (A1)

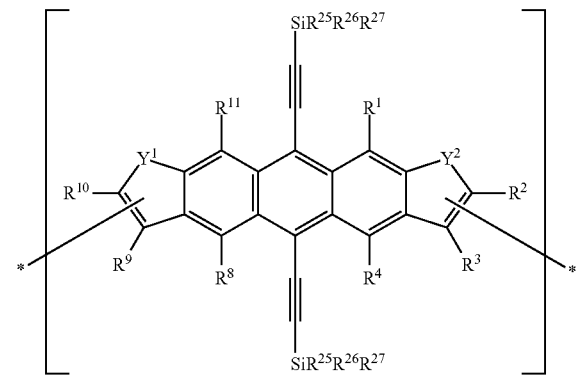

Formula (A2)

wherein R$^{25}$, R$^{26}$ and R$^{27}$ are independently selected from the group consisting of $C_1$-$C_6$ alkyl and $C_2$-$C_6$ alkenyl.

12. A PAHC according to claim 1, wherein the heteroacene monomer units have the Formulae (A3) and (A4):

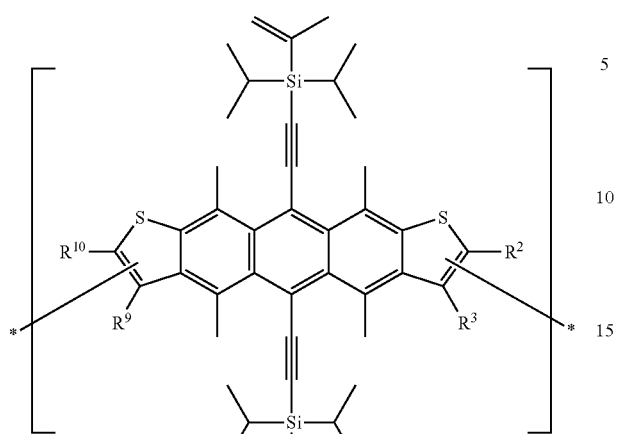

(A3)

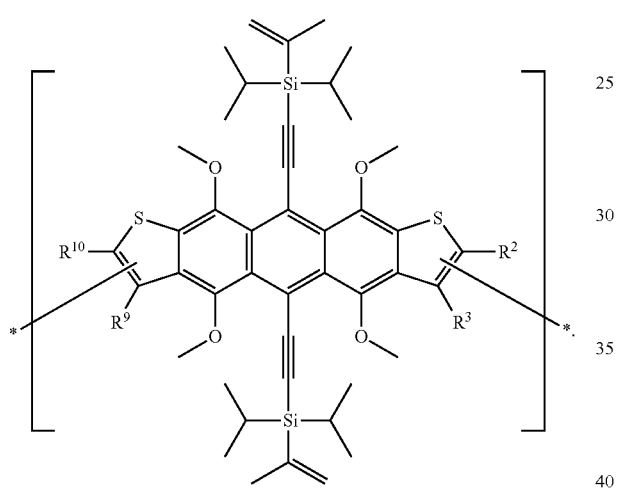

(A4)

13. A PAHC according to claim 1, wherein for the indenofluorene monomer (B/B'), $R^{1'}$, $R^{2'}$, $R^{3'}$, $R^{4'}$, $R^{5'}$, $R^{6'}$, and $R^7$, which may be the same or different, is substituted with at least one polar group.

14. A PAHC according to claim 13, wherein the one or more polar group(s) is independently selected from the group consisting of nitro group, nitrile group, $C_{1-40}$ alkyl group substituted with a nitro group, a nitrile group, a cyanate group, an isocyanate group, a thiocyanate group or a thioisocyanate group; $C_{1-40}$ alkoxy group optionally substituted with a nitro group, a nitrile group, a cyanate group, an isocyanate group, a thiocyanate group or a thioisocyanate group; $C_{1-40}$ carboxylic acid group optionally substituted with a nitro group, a nitrile group, a cyanate group, an isocyanate group, a thiocyanate group or a thioisocyanate group; $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

15. A PAHC according to claim 1, further comprising one or more monomers (C), (D), (D') and/or (E):

(C)

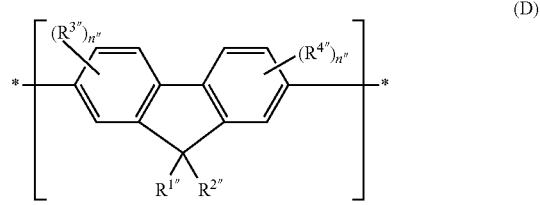

(D)

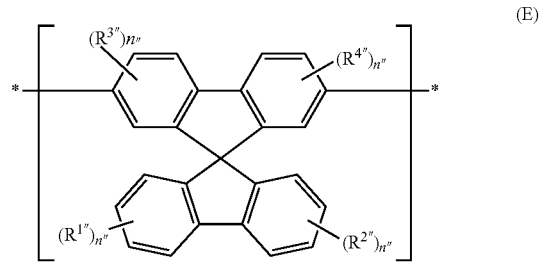

(E)

wherein each $R^{1''}$, $R^{2''}$, $R^{3''}$ and $R^{4''}$, each of which may be the same or different, is selected from the same group as $R^1$, $R^2$, $R^3$, and $R^4$, as defined in claim 1;

$Ar_1$, $Ar_2$ and $Ar_3$, which may be the same or different, each represent, independently an optionally substituted $C_{6-40}$ aromatic group (mononuclear or polynuclear);

wherein n''=1 to 3; and wherein monomer (A) is present in an amount of at least 20 wt. %; monomer (B) is present in an amount of at least 60 wt. % and the remainder is comprised of monomers (C), (D), (D') and/or (E), based on the total weight of all monomer units in the copolymer.

16. An organic semiconductor composition comprising a PAHC according to claim 1 and a polyacene small molecule, wherein the PAHC has a permittivity at 1000 Hz of between 3.4 and 8.0 or between 3.4 and 4.5.

17. An organic semiconductor composition comprising a Polycyclic Aromatic Hydrocarbon Copolymer (PAHC) according to claim 1, wherein the composition has a permittivity at 1000 Hz of between 3 and 6.5, between 3.4 and 8 and between 4 and 6.5.

18. An organic semiconductor composition according to claim 16 having a charge mobility value of at least 0.5 $cm^2V^{-1}s^{-1}$.

19. An organic semiconductor layer or electronic device comprising the organic semiconductor composition according to claim 16.

20. An organic semiconductor layer or electronic device comprising the organic semiconductor composition according to claim 19, wherein the electronic device is selected from organic field effect transistors (OFETS), organic light emitting diodes (OLEDS), photodetectors, organic photovoltaic (OPV) cells, sensors, lasers, memory elements and logic circuits.

21. An ink comprising a PAHC according to claim 1.

22. A process for producing a Polycyclic Aromatic Hydrocarbon Copolymer (PAHC) comprising copolymerising a composition containing at least one heteroacene monomer unit selected from the structures (A') and at least one cis/trans-indenofluorene monomer unit selected from the structure (B/B')' to form a random copolymer, Structure A'

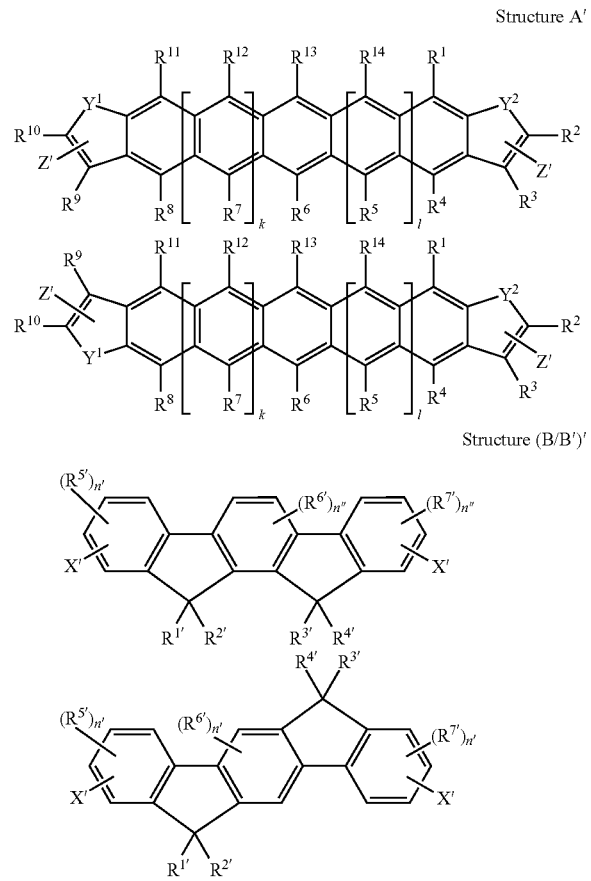

Structure (B/B')' wherein monomers of Formula (A) can be the pure cis isomer, or the pure trans isomer, or a mixture of the cis and trans isomers;

$Y^1$ and $Y^2$ are independently O, S, Se or NR'''';

R'''' is H or cyclic, straight-chain or branched $C_1$ to $C_{10}$ alkyl group, wherein each of $R^1$, $R^2$, $R^3$, $R^4$, $R^5$, $R^7$, $R^8$, $R^9$, $R^{10}$, $R^{11}$, $R^{12}$, and $R^{14}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$) a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group; a $C_2$-$C_{10}$ alkynyl group substituted with a —SiH$_2$R$^{22}$ group, a $C_2$-$C_{10}$ alkynyl substituted with a —SiHR$^{22}$R$^{23}$ group, or a $C_2$-$C_{10}$ alkynyl moiety substituted with a —Si(R$^{22}$)$_x$(R$^{23}$)$_y$(R$^{24}$)$_z$ group;

wherein each of R$^6$ and R$^{13}$, which may be the same or different, independently represents a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group; a $C_2$-$C_{10}$ alkynyl group substituted with a —SiH$_2$R$^{22}$ group, a $C_2$-$C_{10}$ alkynyl substituted with a —SiHR$^{22}$R$^{23}$ group, or a $C_2$-$C_{10}$ alkynyl moiety substituted with a —Si(R$^{22}$)$_x$(R$^{23}$)$_y$(R$^{24}$)$_z$ group;

wherein each R$^{22}$ group is independently selected from the group consisting of a branched or unbranched, substituted or unsubstituted $C_1$-$C_{10}$ alkyl group, a branched or unbranched, substituted or unsubstituted $C_2$-$C_{10}$ alkynyl group, a substituted or unsubstituted $C_2$-$C_{20}$ cycloalkyl group, a substituted or unsubstituted $C_2$-$C_{10}$ alkenyl group, and a substituted or unsubstituted $C_6$-$C_{20}$ cycloalkylalkylene group;

each R$^{23}$ group is independently selected from the group consisting of a branched or unbranched, substituted or unsubstituted $C_1$-$C_{10}$ alkyl group, a branched or unbranched, substituted or unsubstituted $C_2$-$C_{10}$ alkynyl group, a substituted or unsubstituted $C_2$-$C_{10}$ alkenyl group, a substituted or unsubstituted $C_2$-$C_{20}$ cycloalkyl group, and a substituted or unsubstituted $C_6$-$C_{20}$ cycloalkylalkylene group;

R$^{24}$ is independently selected from the group consisting of hydrogen, a branched or unbranched, substituted or unsubstituted $C_2$-$C_{10}$ alkynyl group, a substituted or unsubstituted $C_2$-$C_{20}$ cycloalkyl group, a substituted or unsubstituted $C_6$-$C_{20}$ cycloalkylalkylene group, a substituted $C_5$-$C_{20}$ aryl group, a substituted or unsubstituted $C_6$-$C_{20}$ arylalkylene group, an acetyl group, a substituted or unsubstituted $C_3$-$C_{20}$ heterocyclic ring comprising at least one of O, N, S and Se in the ring;

wherein x=1 or 2; y=1 or 2; z=0 or 1; and (x+y+z)=3;

wherein each of R$^{15}$, R$^{16}$, R$^{18}$, R$^{19}$ and R$^{20}$ independently represent H or optionally substituted $C_1$-$C_{40}$ carbyl or hydrocarbyl group optionally comprising one or more heteroatoms;

wherein $R^{17}$ represents a halogen atom, H or optionally substituted $C_1$-$C_{40}$ carbyl or $C_1$-$C_{40}$ hydrocarbyl group optionally comprising one or more heteroatoms;

wherein k and l are independently 0 or 1;

wherein $R^{1'}$, $R^{2'}$, $R^{3'}$, $R^{4'}$, $R^{5'}$, $R^{6'}$ and $R^{7'}$ which may be the same or different, independently each represent, hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group;

wherein at least one of $R^{1'}$, $R^{2'}$, $R^{3'}$, $R^{4'}$, $R^{5'}$, $R^{6'}$ and $R^{7'}$ groups is a polar group, and n=1 to 20;

wherein X' is a halogen atom or a cyclic borate group; and wherein Z' is a halogen atom.

23. An organic semiconductor composition according to claim 16 having a charge mobility value of between 2 and 5.0 cm$^2$V$^{-1}$s$^{-1}$.

24. A PAHC according to claim 1, wherein R"" is H.

25. A process according to claim 22, wherein R"" is H.

26. A PAHC according to claim 1, wherein at least one of $R^{1'}$, $R^{2'}$, $R^{3'}$, $R^{4'}$, $R^{5'}$, $R^{6'}$, and $R^{7'}$ is substituted with at least one polar group which is independently selected from the group consisting of nitro group, nitrile group, $C_{1-40}$ alkyl group substituted with a nitro group, a nitrile group, a cyanate group, an isocyanate group, a thiocyanate group or a thioisocyanate group; a $C_{1-40}$ alkoxy group optionally substituted with a nitro group, a nitrile group, a cyanate group, an isocyanate group, a thiocyanate group or a thioisocyanate group; a $C_{1-40}$ carboxylic acid group optionally substituted with a nitro group, a nitrile group, a cyanate group, an isocyanate group, a thiocyanate group or a thioisocyanate group; a $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

27. A PAHC according to claim 8, wherein at least 2 of $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are (tri-$C_{1-20}$ hydrocarbylsilyl)$C_{1-4}$alkynyl-groups.

28. A PAHC according to claim 8, wherein at least one of $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are (trihydrocarbylsilyl)ethynyl-groups.

29. A PAHC according to claim 8, wherein at least two of $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are (trihydrocarbylsilyl)ethynyl-groups.

30. A PAHC according to claim 11, wherein $R^{25}$, $R^{26}$ and $R^{27}$ are independently selected from the group consisting of methyl, ethyl, propyl, isopropyl, n-butyl, isobutyl, t-butyl, 1-propenyl and 2-propenyl.

31. A PAHC according to claim 29, wherein $R^{25}$, $R^{26}$ and $R^{27}$ are independently selected from the group consisting of ethyl, n-propyl and isopropyl.

32. A PAHC according to claim 13, wherein for the indenofluorene monomer (B/B'), $R^{1'}$, $R^{2'}$, $R^{3'}$, $R^{4'}$, $R^{5'}$, $R^{6'}$, and $R^{7'}$ which may be the same or different, at least one of $R^{1'}$, $R^{2'}$, $R^{3'}$, $R^{4'}$, $R^{5'}$, $R^{6'}$, and $R^{7'}$ is substituted with at least one polar group, and n=1 to 20.

33. A PAHC according to claim 15, wherein at least one of $Ar_1$, $Ar_2$ and $Ar_3$ is substituted with at least one polar group, and n=1 to 20.

34. A PAHC according to claim 33, wherein n=1 to 10.

35. A PAHC according to claim 33, wherein n=1 to 5.

36. A PAHC according to claim 33, wherein at least one of $Ar_1$, $Ar_2$ and $Ar_3$ is substituted with 1, 2, 3, or 4 polar group(s).

37. A PAHC according to claim 33, wherein at least one of $Ar_1$, $Ar_2$ and $Ar_3$ is substituted with 1, 2, or 3 polar group(s).

38. A PAHC according to claim 33, wherein at least one of $Ar_1$, $Ar_2$ and $Ar_3$ is substituted with 1 or 2 polar group(s).

39. A process according to claim 22, wherein at least one of $R^{1'}$, $R^{2'}$, $R^{3'}$, $R^{4'}$, $R^{5'}$, $R^{6'}$ and $R^{7'}$ is substituted with at least one polar group which is independently selected from the group consisting of nitro group, nitrile group, $C_{1-40}$ alkyl group substituted with a nitro group, a nitrile group, a cyanate group, an isocyanate group, a thiocyanate group or a thioisocyanate group; a $C_{1-40}$ alkoxy group optionally substituted with a nitro group, a nitrile group, a cyanate group, an isocyanate group, a thiocyanate group or a thioisocyanate group; a $C_{1-40}$ carboxylic acid group optionally substituted with a nitro group, a nitrile group, a cyanate group, an isocyanate group, a thiocyanate group or a thioisocyanate group; a $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

40. An organic semiconductor layer or electronic device according to claim 19, wherein said composition is embedded in an semiconductor layer or electronic device comprising said organic semiconductor composition.

* * * * *

UNITED STATES PATENT AND TRADEMARK OFFICE
CERTIFICATE OF CORRECTION

PATENT NO. : 10,056,551 B2
APPLICATION NO. : 14/379797
DATED : August 21, 2018
INVENTOR(S) : Russell Jon Griffiths Page 1 of 1

It is certified that error appears in the above-identified patent and that said Letters Patent is hereby corrected as shown below:

In the Claims

Claim 1, Column 63, Lines 42-49, delete the entire contents and replace with --

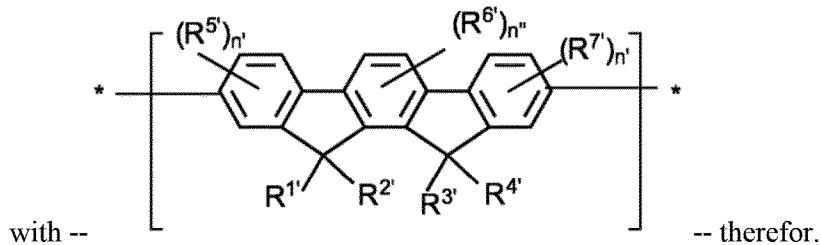

-- therefor.

Claim 22, Column 69, Lines 25-30, delete the entire contents and replace with --

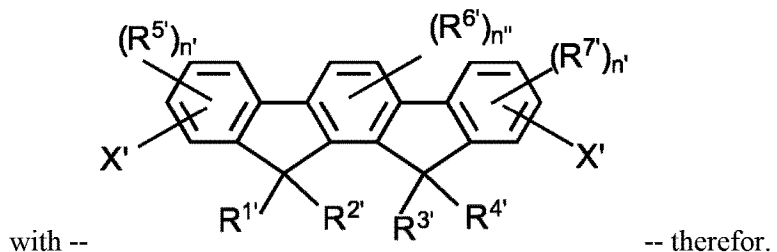

-- therefor.

Claim 22, Column 69, Line 64, insert a -- ; -- at the end of Line 64.

Signed and Sealed this
Thirteenth Day of November, 2018

Andrei Iancu
*Director of the United States Patent and Trademark Office*